United States Patent
Hayashi et al.

(10) Patent No.: US 10,916,361 B2
(45) Date of Patent: Feb. 9, 2021

(54) OXIDE SUPERCONDUCTOR AND METHOD FOR MANUFACTURING THE SAME

(71) Applicant: Kabushiki Kaisha Toshiba, Tokyo (JP)

(72) Inventors: Mariko Hayashi, Tokyo (JP); Takeshi Araki, Tokyo (JP); Hiroyuki Fuke, Yokohama Kanagawa (JP); Nao Kobayashi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 614 days.

(21) Appl. No.: 15/887,135

(22) Filed: Feb. 2, 2018

(65) Prior Publication Data

US 2018/0197659 A1 Jul. 12, 2018

Related U.S. Application Data

(63) Continuation of application No. PCT/JP2016/072064, filed on Jul. 27, 2016.

(30) Foreign Application Priority Data

Feb. 26, 2016 (JP) .................. 2016-035645

(51) Int. Cl.
*H01B 12/06* (2006.01)
*C01G 3/00* (2006.01)
(Continued)

(52) U.S. Cl.
CPC ............. *H01B 12/06* (2013.01); *C01G 1/02* (2013.01); *C01G 3/00* (2013.01); *C01G 3/006* (2013.01);
(Continued)

(58) Field of Classification Search
None
See application file for complete search history.

(56) References Cited

U.S. PATENT DOCUMENTS 7,361,627 B2  4/2008  Araki et al.
7,615,515 B2  11/2009  Araki et al.
(Continued)

FOREIGN PATENT DOCUMENTS

EP    2 641 887 A2    9/2013
JP    07-264774 A    10/1995
(Continued)

OTHER PUBLICATIONS

Cao et al., "Superconducting $T_c$ and normal-state resistivity in $Nd_{1-x}Pr_x Ba_2Cu_3O_{7-\delta}$ system," Physica C, 259:361-364 (1996).
(Continued)

*Primary Examiner* — Paul A Wartalowicz
(74) *Attorney, Agent, or Firm* — Finnegan, Henderson, Farabow, Garrett & Dunner, L.L.P.

(57) ABSTRACT

An oxide superconductor according to an embodiment includes an oxide superconducting layer includes a single crystal having a continuous perovskite structure containing at least one rare earth element selected from the group consisting of yttrium, lanthanum, neodymium, samarium, europium, gadolinium, terbium, dysprosium, holmium, erbium, thulium, ytterbium, and lutetium, barium, and copper, containing praseodymium is a part of the site of the rare earth element in the perovskite structure, and having a molar ratio of praseodymium of 0.00000001 or more and 0.2 or less with respect to the sum of the at least one rare earth element and praseodymium; fluorine in an amount of $2.0 \times 10^{15}$ atoms/cc or more and $5.0 \times 10^{19}$ atoms/cc or less; and carbon in an amount of $1.0 \times 10^{17}$ atoms/cc or more and $5.0 \times 10^{20}$ atoms/cc or less.

12 Claims, 10 Drawing Sheets

(51) Int. Cl.
  *H01L 39/12* (2006.01)
  *H01L 39/24* (2006.01)
  *C04B 35/622* (2006.01)
  *C04B 35/45* (2006.01)
  *C01G 1/02* (2006.01)
  *H01B 12/16* (2006.01)
  *H01B 13/00* (2006.01)
  *H01F 6/06* (2006.01)

(52) U.S. Cl.
  CPC .... *C04B 35/4508* (2013.01); *C04B 35/62218* (2013.01); *C04B 35/62222* (2013.01); *H01B 12/16* (2013.01); *H01B 13/0016* (2013.01); *H01L 39/126* (2013.01); *H01L 39/128* (2013.01); *H01L 39/2425* (2013.01); *C01P 2002/34* (2013.01); *C01P 2002/72* (2013.01); *C01P 2002/77* (2013.01); *C01P 2004/04* (2013.01); *C01P 2006/40* (2013.01); *C04B 2235/445* (2013.01); *C04B 2235/449* (2013.01); *C04B 2235/768* (2013.01); *C04B 2235/787* (2013.01); *H01F 6/06* (2013.01)

(56) References Cited

U.S. PATENT DOCUMENTS

| | | | |
|---|---|---|---|
| 7,774,035 B2 * | 8/2010 | Lee | H01L 39/247 505/231 |
| 7,833,941 B2 | 11/2010 | Araki | |
| 7,902,120 B2 | 3/2011 | Rupich et al. | |
| 9,023,764 B2 | 5/2015 | Araki et al. | |
| 2006/0058195 A1 | 3/2006 | Araki et al. | |
| 2006/0153969 A1 | 7/2006 | Araki et al. | |
| 2008/0153709 A1 | 6/2008 | Rupich et al. | |
| 2014/0031236 A1 | 1/2014 | Araki et al. | |
| 2017/0309805 A1 | 10/2017 | Araki et al. | |

FOREIGN PATENT DOCUMENTS

| | | | |
|---|---|---|---|
| JP | 10-125146 A | 5/1998 | |
| JP | 4044635 B2 | 5/1998 | |
| JP | 2004-253645 A | 9/2004 | |
| JP | 4050730 B2 | 2/2006 | |
| JP | 4208806 B2 | 3/2006 | |
| JP | 4738322 B2 | 6/2008 | |
| JP | 2013-201014 A | 10/2013 | |
| WO | WO 2006/011684 A1 | 2/2006 | |
| WO | WO 2017/046974 A1 * | 3/2017 | |

OTHER PUBLICATIONS

M. W. Rupich, et al., "Advances in second generation high temperature superconducting wire manufacturing and R&D at American Superconductor Corporation", Superconductor Science and Technology 23 (2010) 014015 (9 pages).

P. Mele, et al., "Incorporation of double artificial pinning centers in $YBa_2Cu_3O_{7-\delta}$ films", Physica C, 468 (2008) 1631-1634.

H. Iwasaki, et al., "Anisotropic behavior of superconductivity in $Y_{1-x}Pr_xBa_2Cu_3O_y$ films", Physica C, 244 (1995) 71-77.

X Q Xu, et al., "Effect of Pr doping on the growth and superconducting properties of $(Y_{1-x}Pr_x)Ba_2Cu_3O_{7-\delta}$", Superconductor Science and Technology 22 (2009) 015001 (6 pages).

T. Araki, et al., "Growth model and the effect of CuO nanocrystallites on the roperties of chemically derived epitaxial thin films of $YBa_2Cu_3O_{7-x}$", Journal of Applied Physics vol. 92, No. 6, 2002, pp. 3318-3325.

T. Araki, et al., "Purified Coating Solution and Growth Scheme of the $YBa_2Cu_3O_{7-x}$ Superconductors in Metal Organic Deposition Using Trifluoroacetates", Bull. Chem. Soc. Jpn., 77, No. 6, 1051-1061 (2004).

B. C. Harrison, et al., "Pr Doped YBCO Films Produced by Pulsed Laser Deposition", Materials Research Society Symposium Proceedings vol. 946, pp. 49-54 (2006).

International Search Report, PCT JP2016/072064, dated Sep. 27, 2016 (2 pages).

* cited by examiner

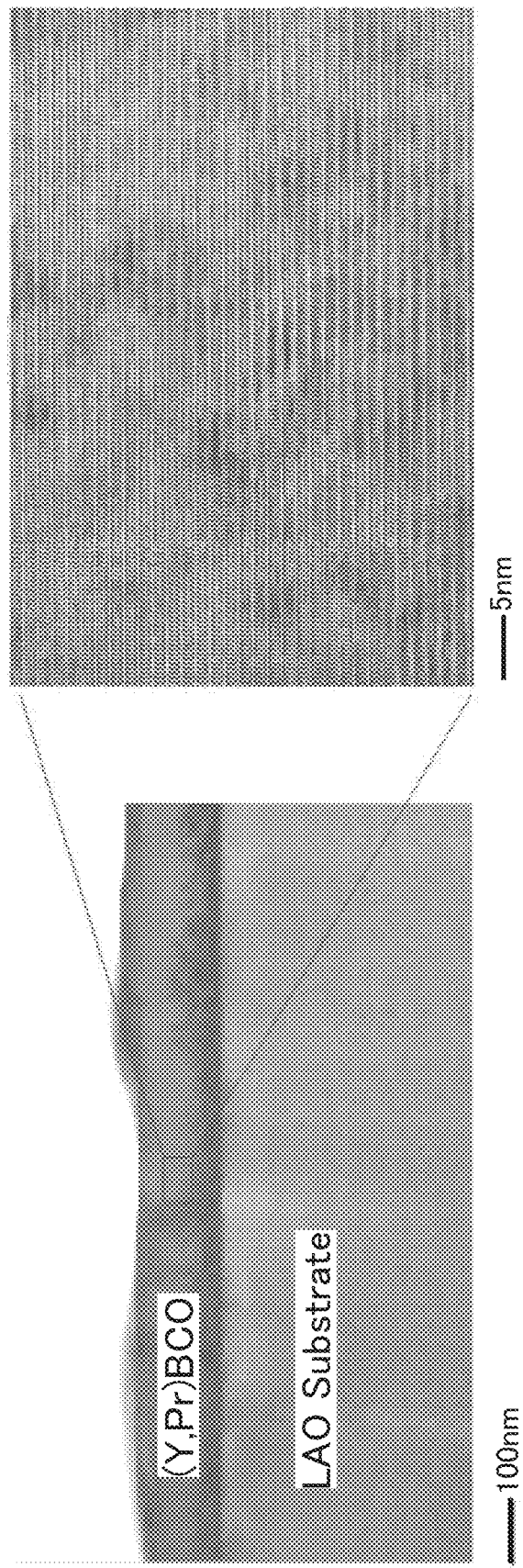

OXIDE SUPERCONDUCTOR AND METHOD FOR MANUFACTURING THE SAME

CROSS-REFERENCE TO RELATED APPLICATION

This application is continuation application of, and claims the benefit of priority from Japanese Patent Application No. 2016-035645, filed or Feb. 26, 2016, and the international Application PCT/JP2016/072064, filed Jul. 27, 2016, the entire contents of which are incorporated herein by reference.

FIELD

Embodiments described herein relate generally to an oxide superconductor and a method for manufacturing the same.

BACKGROUND

Superconduction is a phenomenon to make a resistance value completely zero, which was found using mercury by Dutch Kamerring Onnes who developed a freezer. Subsequently, a superconducting transition temperature (Tc) was defined as 39 K by Bardeen Cooper Schrieffer (BCS) theory, but this was Tc of a first type superconductor.

In a second type superconductor found by Bednorz or the like in 1986, a result better than 39 K was indicated, leading to development of an oxide superconductor which can be used at a liquid nitrogen temperature. The oxide superconductor is a second type superconductor in which a superconducting state and a non-superconducting state are mixed. At present, many high temperature oxide superconductors which can be used at a liquid nitrogen temperature are on sale in a lot of 500 m. Application of a superconducting wire material is expected to various large apparatuses such as a superconducting power transmission cable, a nuclear fusion furnace, a magnetically levitated train, a particle accelerator, and a magnetic diagnostic apparatus (MRI).

Typical examples of a developed high temperature oxide superconductor include a bismuth-based superconducting wire material called a first generation and an yttrium-based superconducting wire material called a second generation. Manufacturing withdrawal of the first generation requiring silver in an amount of 60 vol % or more has occurred successively, and extremely a few companies manufacture the first generation now in the world.

Meanwhile, a total sold wire length of the second generation in which a substrate is inexpensive and a physical strength is excellent is more than 3,000 km. A 50 MVA DC power transmission cable system manufactured using a large amount of wire materials had an operation achievement result of three years or more at the point of August 2015. Since September 2014, a DC power transmission cable system having a capacity of 500 MVA has been operated. A power transmission capacity of 500 MVA is a large-scale power transmission system corresponding to power of approximately 50% of a standard nuclear reactor.

The wire material has been sold in a total length of 3,000 km or more. A large contract of 20 km or more in a wire length, delivery thereof, and an application achievement, result thereof are obtained by a metal organic deposition using trifluoroacetates (TFA-MOD) method. The TFA-MOD method is a first method which manufactures a wire material having a length of 500 m stably, can supply the wire material in a large amount, and has an application achievement result.

Typical examples of another main second generation manufacturing method include a pulsed laser deposition (PLD) method and a metal organic chemical vapor deposition (MOCVD) method. However, there is a problem in composition control, and stable mass production of the wire material having a length of 500 m has not been achieved at present. Therefore, the wire material manufactured by the TFA-MOD method has a share of approximately 100% at present.

This fact does not deny future of the PLD method or the MOCVD method. A physical vapor deposition method has difficulty in composition control. However, if a technique capable of controlling three kinds of elements flying in vacuum and having a difference of twice or more relative to one another in an atomic weight so as to have a composition difference of 1% or less at almost the same level as the TFA-MOD method using an inexpensive method is developed, mass production is possible. However, this problem has not been solved for 28 years or more since 1987.

Meanwhile, wire materials manufactured by the PLD method or the MOCVD method are leading in coil application requiring magnetic field characteristics. This is because an artificial pin required for improving magnetic field characteristics is easily introduced. However, a coil manufactured using a superconducting wire material manufactured by the PLD method or the MOCVD method has no achievement result at present. The manufacturing number thereof is considered to be 20 to 30. However, it does not seem that completion of a good coil has been reported.

As one of reasons why a superconducting wire material manufactured by the PLD method or the MOCVD method does not work as coil application, destruction of a superconducting layer due to insufficient strength is pointed out. However, destruction of a superconducting layer due to insufficient strength lowers characteristics to nearly zero. Some superconducting wire materials can cause energization as coils but have defects. Therefore, as a main reason for not succeeding as a coil, something other than destruction of the superconducting layer is considered.

Concerning not succeeding as a coil, it is considered that not capability of obtaining such a magnetic field as designed gives important suggestion. In design of a coil, a coil is manufactured after a superconducting current, the number of turns, and the like are calculated. However, there are many reports on a coil using a YBCO superconducting wire material that only about 70% of a designed magnetic field can be obtained. It seems that nonuniformity inside a superconducting wire material is involved in this.

An index indirectly indicating nonuniformity inside a wire material is Tc which is a superconducting transition temperature. A YBCO superconductor constantly has Tc of 90.7 K in a case where good superconducting characteristics are obtained. A uniform long wire material manufactured by the TFA-MOD method has Tc of 90.7 K regardless of a local region measured.

In order to improve magnetic field characteristics of a superconducting wire material, an artificial pin is introduced, for example, in the PLD method. This is an attempt to introduce, for example, $BaZrO_3$ (hereinafter, referred to as "BZO") which is a non-superconductor in a superconductor and to fix a magnetic flux to that portion, that is, to pin the magnetic flux thereto. However, the superconductor having BZO formed therein lowers Tc. A YBCO superconductor having BZO introduced therein in an amount of about 5% may have Tc of 89.0 K, but the drop in Tc is not necessarily constant. If a YBCO superconductor having BZO introduced therein is applied to a coil, even in design of 10 T, for example, only a 7 T magnetic field can be manufactured in some cases.

BRIEF DESCRIPTION OF THE DRAWINGS

FIGS. 2A, 2B are transmission electron microscope images of the oxide superconductor according to the embodiment.

DETAILED DESCRIPTION

An oxide superconductor according to an embodiment includes an oxide superconducting layer including: a single crystal having continuous perovskite structure, the single crystal containing at least one rare earth element selected from the group consisting of yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu), the single crystal containing barium (Ba) and copper (Cu), the single crystal containing praseodymium (Pr) in a part of sites of rare earth element in perovskite structure, and the single crystal having a molar ratio of praseodymium of 0.00000001 or more and 0.2 or less with respect to the sum of the at least one rare earth element and praseodymium; fluorine in an amount of $2.0 \times 10^5$ atoms/cc or more and $5.0 \times 10^{19}$ atoms/cc or less; and carbon in an amount of $1.0 \times 10^{17}$ atoms/cc or more and $5.0 \times 10^{20}$ atoms/cc or less.

Here, a crystal including a low inclination angle grain boundary having a difference of 1.0 degree or less in a c-axis direction is also assumed to be a "single crystal".

Here, the "molar ratio of praseodymium with respect to the sum of at least one rare earth element selected from the group consisting of yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu)" and praseodymium" means a molar ratio of praseodymium with respect to the sum of all the rare earth elements and praseodymium in a case where a plurality of rare earth elements selected from the group is contained. For example, in a case where yttrium, holmium, and thulium are contained, the "molar ratio of praseodymium with respect to the sum of at least one rare earth element and praseodymium" means a molar ratio of praseodymium with respect to the sum of yttrium, holmium, thulium, and praseodymium.

Hereinafter, an oxide superconductor according to an embodiment is described with reference to the drawings.

Embodiment

An oxide superconductor according to an embodiment includes an oxide superconductor layer including: a single crystal having a perovskite structure containing at least one rare earth element selected from the group consisting of yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu), praseodymium (Pr), barium (Ba), and copper (Cu), a molar ratio of praseodymium with respect to the sum of the at rare earth element and praseodymium being 0.00000001 or more and 0.2 or less; fluorine in an amount of $2.0 \times 10^{15}$ atoms/cc or more and $5.0 \times 10^{19}$ atoms/cc or less; and carbon in an amount of $1.0 \times 10^{17}$ atoms/cc or more and $5.0 \times 10^{20}$ atoms/cc or less.

Figure 1A:
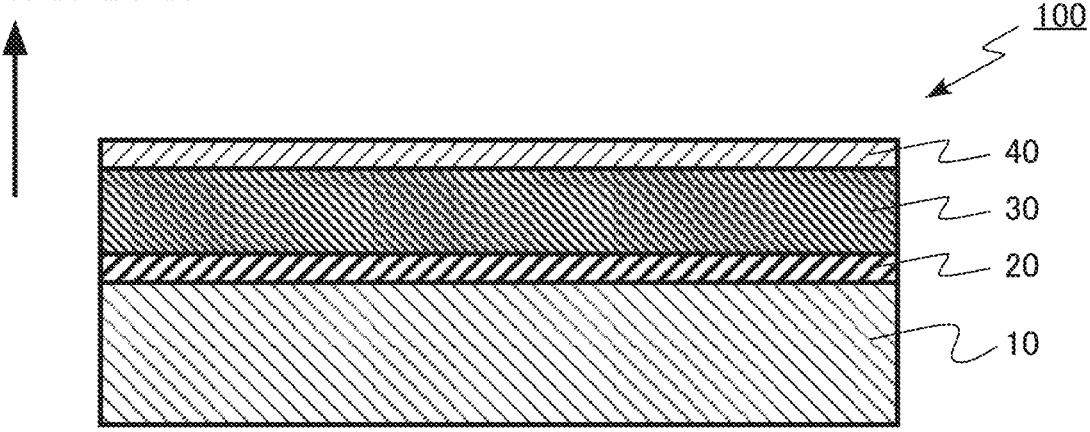
FIGS. 1A, 1B are schematic cross-sectional views of an oxide superconductor according to an embodiment.
Figure 1B:
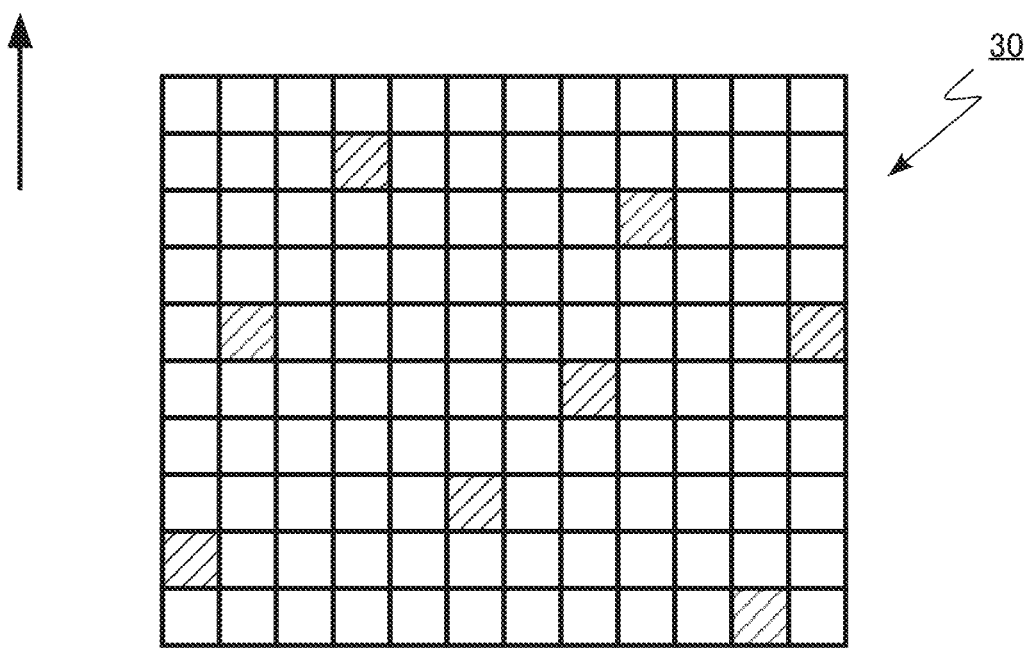

FIGS. 1A, 1B are schematic cross-sectional view of the oxide superconductor according to the present embodiment. FIG. 1A is an overall view. FIG. 1B is an enlarged schematic cross-sectional view of the oxide superconductor layer.

The oxide superconductor according to the present embodiment is a superconducting wire material. The oxide superconductor according to the present embodiment is suitable for an application under a condition in which a magnetic field is applied, for example, for a superconducting coil, a superconducting magnet, an MRI apparatus, a magnetically levitated train, or a superconducting magnetic energy storage (SMES). The oxide superconductor according to the present embodiment can be also applied to a power transmission cable under a condition in which a magnetic field is applied.

As illustrated in FIG. 1A, an oxide superconductor 100 includes a substrate 10, an intermediate layer 20, an oxide superconducting layer 30, and a metal layer 40. The substrate 10 increases mechanical strength of the oxide superconducting layer 30. The intermediate layer 20 is a so-called oriented intermediate layer. The intermediate layer 20 is disposed in order to orient the oxide superconducting layer 30 to obtain a single crystal when a film of the oxide superconducting layer 30 is formed. The metal layer 40 is a so-called stabilizing layer. The metal layer 40 protects the oxide superconducting layer 30. In addition, the metal layer 40 stabilizes the oxide superconductor 100 by causing a current to be bypassed even in a case where a superconducting state becomes partially unstable during actual use of the oxide superconductor 100 as a superconducting wire material.

For example, the substrate 10 is formed of a metal such as a nickel-tungsten alloy. For example, the intermediate layer 20 is formed of yttrium oxide ($Y_2O_3$), yttria stabilized zirconia (YSZ), and cerium oxide ($CeO_2$) from the substrate 10 side. For example, a layer structure of the substrate 10 and the intermediate layer 20 is nickel-tungsten alloy/yttrium oxide/yttria stabilized zirconia/cerium oxide. In this case, the oxide superconducting layer 30 is formed on cerium oxide.

For example, the substrate 10 may be a single crystal layer lattice-matching with the oxide superconducting layer 30. For example, the single crystal layer is formed of lanthanum aluminate ($LaAlO_3$, hereinafter, also referred to as LAO). In this case, the intermediate layer 20 can be omitted.

As the substrate 10 and the intermediate layer 20, for example, an ion beam assisted deposition (IBAD) substrate can be used. In a case of the IBAD substrate, the substrate 10 is a non-oriented layer. The intermediate layer 20 is, for example, formed of a five-layer structure. For example, lower two layers are non-oriented layers, an oriented source layer is formed thereon by an IBAD method, and two metal oxide oriented layers are formed thereon. In this case, the uppermost oriented layer lattice-matches with the oxide superconducting layer 30.

The oxide superconducting layer 30 contains a single crystal having a continuous perovskite structure containing at least one rare earth element selected from the group consisting of yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu), barium (Ba), and copper (Cu). The single crystal contains praseodymium (Pr) in a part of the site of the rare earth element having a continuous perovskite structure. A molar ratio of praseodymium with respect to the sum of the rare earth element and praseodymium in the single crystal is 0.00000001 (10 ppb) or more and 0.2 (20%) or less. The molar ratio of praseodymium with respect to the sum of the rare earth element and praseodymium is, for example, 0.000001 (1 ppm) or more and 0.05 (5%) or less. The molar ratio of praseodymium with respect to the sum of the rare earth element and praseodymium is, for example, 0.001 (0.1%) or more and 0.02 (2%) or less.

The molar ratio of praseodymium with respect to the sum of the rare earth element and praseodymium in the oxide superconducting layer 30 can be measured using, for example, secondary ion mass spectrometry (SIMS) or induced coupled plasma atomic emission spectroscopy (ICP emission spectroscopy).

The single crystal in the oxide superconducting layer 30 has a composition of $(M, Pr) Ba_2Cu_3O_{7-x}$ ($-0.2 \leq x \leq 1$, provided that Pr is 20% or less) in a case where the rare earth element is represented by M. In a case where the rare earth element M is, for example, yttrium (Y), the composition of the single crystal in the oxide superconducting layer 30 is $(Y, Pr) Ba_2Cu_3O_{7-z}$ ($-0.2 \leq x \leq 1$, provided that Pr is 20% or less) (hereinafter, referred to as (Y, Pr) BCO). Hereinafter, the case where the rare earth element M is Y is exemplified.

$YBa_2Cu_3O_{7-y}$ ($0 \leq y \leq 1$) (hereinafter, referred to as YBCO) and $PrBa_2Cu_3O_{7-z}$ ($-1 \leq z \leq 1$) (hereinafter, referred to as PrBCO) are contained in the same single crystal having a perovskite structure. A part of the site of Y in the single crystal having a perovskite structure is replaced with Pr. In this case, a molar ratio of Y with respect to the sum of Y and Pr in the in the single crystal is 0.00000001 or more and 0.2 or less. In other words, in a case where the sum of the numbers of atoms of Y and Pr in the single crystal is assumed to be 100%, an atomic percentage (atomic %) of Pr is 10 ppb or more and 20% or less.

For example, the metal layer 40 is formed of a metal containing silver (Ag) or copper (Cu) as a base material, and may be an alloy. The metal layer 40 may contain a small amount of precious metal such as gold (Au).

FIG. 1B is an enlarged schematic cross-sectional view of the oxide superconducting layer 30. Each rectangle indicates a unit cell in the single crystal. A hollow portion is a unit cell of a region containing Y, that is, a unit cell of YBCO. A hatched portion is a unit cell of a region containing Pr, that is, a unit cell of PrBCO.

As illustrated in FIG. 1B, a unit cell of PrBCO is dispersed in the single crystal. In other words, Pr is dispersed at an atomic level in the single crystal mainly containing YBCO having a perovskite structure.

PrBCO is a non-superconductor. Therefore, a region containing Pr in the oxide superconducting layer 30 is a non-superconductor. The region containing Pr functions as an artificial pin of the oxide superconducting layer 30.

For example, the layer thickness of the oxide superconducting layer 30 is 0.1 μm or more and 10 μm or less. For example, the oxide superconducting layer 30 is formed of a single crystal in an entire layer thickness direction.

For example, the single crystal is present in a range of 50 nm or more from the substrate 10 side in the oxide superconducting layer 30 and 70% or less of an average layer thickness of the oxide superconducting layer in the oxide superconducting layer 30. For example, the single crystal has a size of 500 nm×10 nm or more in a cross section of the oxide superconducting layer 30 in a layer thickness direction thereof.

FIGS. 2A, 2B are transmission electron microscope (TEM) images of the oxide superconductor according to the present embodiment. FIG. 2A is an observation image with a low magnification of 200,000 times. FIG. 2B is an observation image with a high magnification of 4,300,000 times, obtained by enlarging a part. FIGS. 2A, 2B are cross sections of an oxide superconducting layer in a layer thickness direction thereof.

FIGS. 2A, 2B is a cross-sectional TEM image of a sample which is a film of (Y, Pr) BCO formed on a LAO substrate on the assumption that an average film thickness is 150 nm. An atomic percentage of Pr is 10%.

From the observation image in FIG. 2B, an oriented perovskite structure at an atomic level can be confirmed. Image fluctuation is slightly observed on the LAO substrate side. However, it can be seen that there is no heterogeneous phase in (Y, Pr) BCO and unit cells with the same lattice constant are arranged. In other words, (Y, Pr) BCO in FIGS. 2A, 2B is formed of a single crystal having a perovskite structure. (Y, Pr) BCO FIGS. 2A, 2B is the single crystal having perovskite structure in a layer thickness direction. The single crystal has a size of 500 nm×100 nm or more.

If Pr is unevenly distributed in an amount of 10%, an internal perovskite structure should be distorted due to a difference in lattice constant. However, in FIG. 2(b), no distorted structure is observed. Therefore, it is considered that (Y, Pr) BCO with a Pr atomic percentage of 10% has a single lattice structure and a part of a unit cell is PrBCO. It is considered that a structure in which PrBCO does not form an assembly but a YBCO unit cell is adjacent to a PrBCO unit cell is realized.

Figure 3:
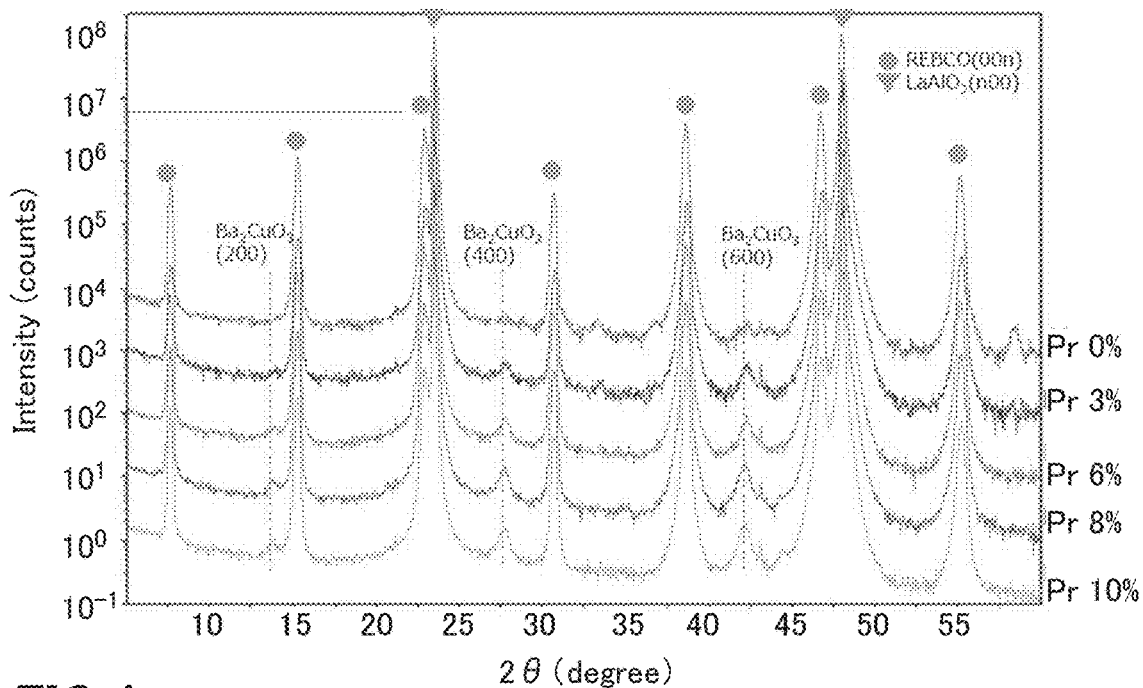
FIG. 3 is a diagram illustrating a result of X-ray diffraction measurement of an oxide superconducting layer according to the embodiment.

FIG. 3 is a diagram illustrating a result of X-ray diffraction (XRD) measurement of the oxide superconducting layer according to the present embodiment. FIG. 3 illustrates measurement results of samples obtained by a 2θ/ω method in a case where a Pr atomic percentage in (Y, Pr) BCO was changed to 0%, 3%, 6%, 8%, and 10%. Note that, in FIG. 3, the sample having an atomic percentage of 10% is the same as the sample of the TEM image in FIG. 2.

The horizontal axis indicates 2θ, and the vertical axis indicates intensity in logarithmic display. The data indicates data with Pr atomic percentages of 0%, 3%, 6%, 8%, and 10% in order from the top. For comparison, results of five samples are displayed simultaneously at a position where the intensity is changed by about 10 times for each sample. A true value of the intensity is about 100,000 cps at a YBCO (006) peak around 2θ=46.68°.

A circle in FIG. 3 indicates a peak position (REBCO (00n)) of a compound represented by a composition of $REBa_2Cu_3O_{7-x}$ ($0 \le x \le 1$, provided that $-1 \le x \le 1$ in a case where RE represents Pr and a valence varies)). Here, RE represents a rare earth element. Hereinafter, the compound is referred to as REBCO. In FIG. 3, an inverted triangle indicates a peak position ($LaAlO_3$(n00)) of LAO used as a substrate of a sample.

In each of the samples, there is no clear peak other than the peaks of REBCO and LAO. In a sample with a Pr atomic percentage of 10%, if YBCO and PrBCO are separated inside an oxide superconducting layer, it is considered that peaks thereof are observed separately. Particularly, it is considered that separation of peaks is observed on a high angle side such as (006) where a peak angular difference is large.

As is clear from FIG. 3, the strongest peak at a high angle of a YBCO-based superconductor appears at (006). The (006) peak is the sixth peak from the left among the peaks marked with circles in FIG. 3. Even at the (006) peak, the peak is not separated. The peak of PrBCO containing Pr having a larger atomic radius than Y is theoretically considered to appear on a lower angle side by about 0.5 degrees than the peak of YBCO. However, in FIG. 3, the (006) peak is not separated. Therefore, it is considered that a single perovskite structure is realized in the sample with a Pr atomic percentage of 10%.

In a case where a single perovskite structure with an intermediate lattice constant is obtained by mixing YBCO and PrBCO, it is considered that an intermediate intensity peak between YBCO and REBCO is obtained. A combination of large intensity peaks of YBCO or REBCO is determined by an X-ray at diffraction shadowed in a path. In a case where a structure with an intermediate lattice constant is obtained by mixing substances having nearly the same lattice constant and different strong peak surface indices, a pattern of a strong peak is intermediate. If the phenomenon is observed, this is indirect evidence indicating that an intermediate structure is obtained.

In FIG. 3, in a measurement result of the sample with a Pr atomic percentage of 10% at the bottom of the graph, a (001) peak is strong and indicates intensity close to a (002) peak. This also indirectly indicates that an intermediate structure between YBCO and PrBCO is formed.

In samples with Pr atomic percentages of 3%, 6%, and 8%, the strongest peak (006) is not separated. Therefore, it is considered that a single perovskite structure is realized.

The oxide superconducting layer 30 according to the present embodiment contains fluorine in an amount of $2.0 \times 10^{15}$ atoms/cc or more and $5.0 \times 10^{19}$ atoms/cc or less and carbon in an amount of $1.0 \times 10^{17}$ atoms/cc or more and $5.0 \times 10^{20}$ atoms/cc or less. Fluorine and carbon contained in the oxide superconducting layer 30 are residual elements caused by forming a film of the oxide superconducting layer 30 by a TFA-MOD method. For example, fluorine and carbon in the oxide superconducting layer 30 are present in a grain boundary of a single crystal. For example, fluorine is contained in the oxide superconducting layer 30 in an amount of $2.0 \times 10^{16}$ atoms/cc or more. For example, carbon is contained in the oxide superconducting layer 30 in an amount of $1.0 \times 10^{18}$ atoms/cc or more.

For example, the amount of each of fluorine and carbon in the oxide superconducting layer 30 can be measured using SIMS.

In the oxide superconducting layer 30 according to the present embodiment, a c-axis length of a single crystal constituting the oxide superconducting layer 30 is shorter than a c-axis length of a single crystal having a perovskite structure, including yttrium, barium, and copper, and having a molar ratio of praseodymium of less than 0.001 with respect to the sum of yttrium and praseodymium.

Figure 4:
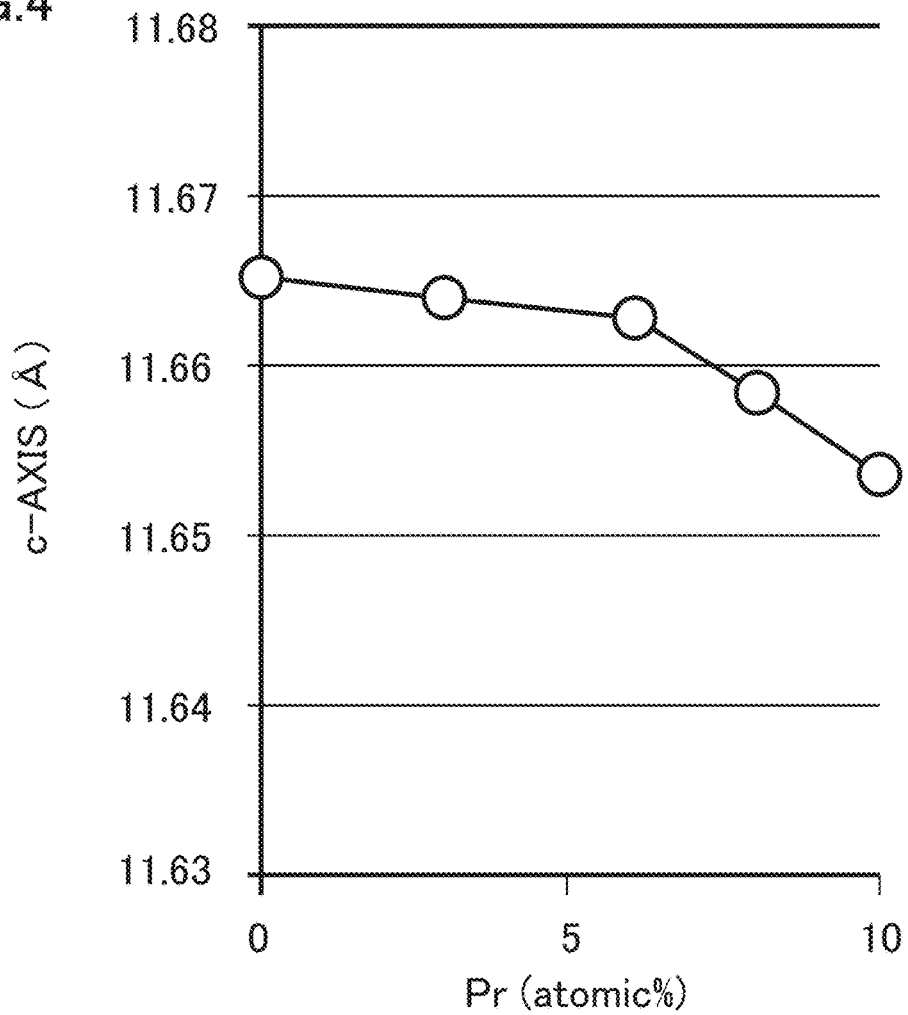
FIG. 4 is a graph illustrating a relationship between the content of Pr and a c-axis length in the oxide superconducting layer according to the embodiment.

FIG. 4 is a graph illustrating a relationship between the content of Pr and a c-axis length in the oxide superconducting layer according to the present embodiment. When Pr is contained in an amount of 10%, the c-axis length is shorter by about 1% compared with a case where Pr is not contained.

In a single crystal contained in the oxide superconducting layer 30 according to the present embodiment, a ratio of unit cells containing yttrium is 0.0050 or more with respect to all the unit cells that can be adjacent to a unit cell containing praseodymium. The ratio of unit cells containing yttrium with respect to all the unit cells that can be adjacent to a unit cell containing praseodymium is desirably 0.010 or more in the single crystal from a viewpoint of further improving magnetic field characteristics. The ratio of unit cells containing yttrium with respect to all the unit cells that can be adjacent to a unit cell containing praseodymium is more desirably 0.025 or more in the single crystal.

Next, a method for manufacturing the oxide superconductor 100 according to the present embodiment is described. The intermediate layer 20 is formed on the substrate 10, the oxide superconducting layer 30 is formed on the intermediate layer 20, and the metal layer 40 is formed on the oxide superconducting layer 30. The oxide superconducting layer 30 is formed by a TFA-MOD method.

For forming the oxide superconducting layer 30, first, an aqueous solution containing an acetate of at least one rare earth element selected from the group consisting of yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu), an acetate of praseodymium (Pr), barium (Ba), and an acetate of copper (Cu), and having a molar ratio of praseodymium of 0.00000001 (10 ppb) or more and 0.2 (20%) or less with respect to the sum of the rare earth element and praseodymium, is prepared. Subsequently, the aqueous solution is mixed with a perfluorocarboxylic acid mainly containing trifluoroacetic acid to prepare a mixed solution, and the mixed solution is subjected to a reaction and purification to prepare a first gel. Subsequently, an alcohol containing methanol is added to the first gel and is dissolved therein to prepare an alcohol solution, and the alcohol solution is subjected to a reaction and purification to prepare a second gel. Subsequently, an alcohol containing methanol is added to the second gel and is dissolved therein to prepare a coating solution in which a total weight of residual water and residual acetic acid is 2 wt % or less, and the coating solution is applied onto a substrate to form a gel film. Subsequently, the gel film is subjected to calcining at 400° C. or lower to form a calcined film. Subsequently, the calcined film is subjected to firing under a humidified atmosphere at 725° C. or higher and 850° C. or lower and oxygen annealing to form the oxide superconducting layer (oxide superconductor film) 30.

The perfluorocarboxylic acid desirably contains 98 mol % or more trifluoroacetic acid from a viewpoint of preventing reduction of superconducting characteristics.

Figure 5:
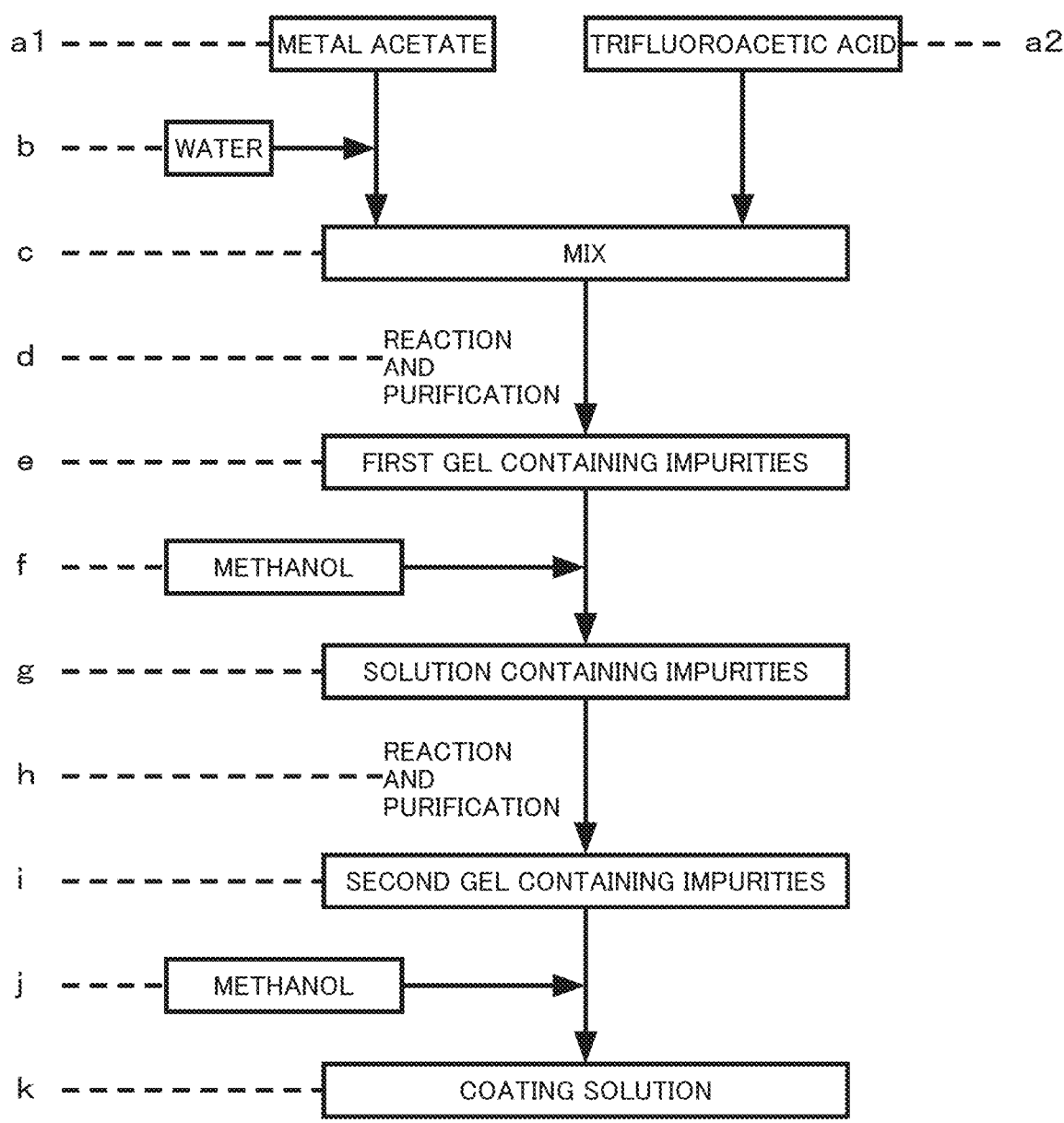
FIG. 5 is a flowchart exemplifying preparation of a coating solution according to the embodiment.

FIG. 5 is a flowchart exemplifying preparation of a coating solution according to the present embodiment. Hereinafter, a case where the rare earth element is yttrium is exemplified.

As illustrated in FIG. 5, a metal acetate of each of yttrium, praseodymium, barium, and copper is prepared (a1). Trifluoroacetic acid is prepared (a2). Subsequently, the prepared metal acetate is dissolved in water (b), and is mixed with the prepared trifluoroacetic acid (c). The obtained solution is subjected to a reaction and purification (d) to obtain a first gel containing impurities (e). Thereafter, the obtained first gel is dissolved in methanol (f) to prepare a solution containing impurities (g). The obtained solution is subjected to a reaction and purification, and impurities are removed (h) to obtain a second gel containing a solvent (i). Furthermore, the obtained second gel is dissolved in methanol (j) to prepare a coating solution (k).

As the metal acetate, a metal salt is mixed at (Y, Pr):Ba:Cu=1:2:3. Mixing is performed such that a value of $Pr/(Y+Pr)$ is 0.00000001 or more and 0.20 or less. After mixing and the reaction, the total content of the residual water and acetic acid in the coating solution is reduced to 2 wt % or less by a high purity solution purifying process using a stabilized solvent-into-gel (SIG) method. The SIG method according to the present embodiment is a method for highly purifying a solution to be partially stabilized for preventing decomposition of PrBCO, and is a partially stabilized solvent-into-gel (PS-SIG) method. For example, mixing is performed such that a value of $Pr/(Y+Pr)$ is 0.00000001 or more and 0.10 or less.

Figure 6:
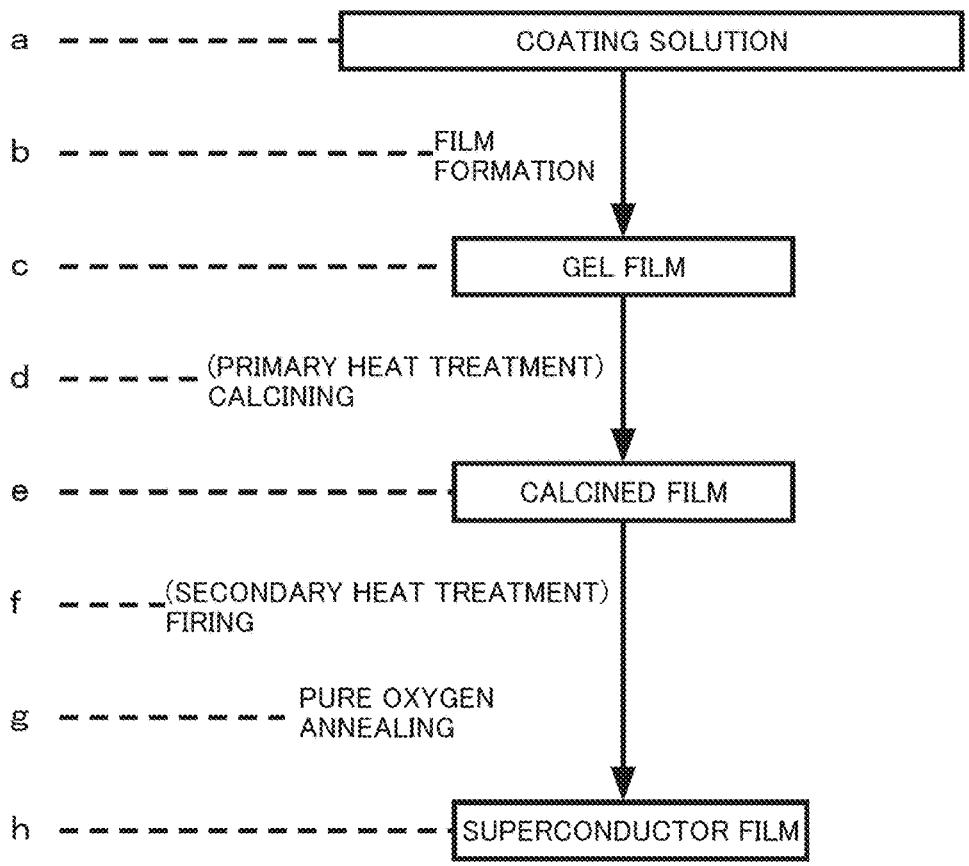
FIG. 6 is a flowchart exemplifying a method for forming a film of a superconductor from the coating solution according to the embodiment.

FIG. 6 is a flowchart exemplifying a method for forming a film of a superconductor from the coating solution according to the present embodiment.

As illustrated in FIG. 6, first, the coating solution prepared in advance is prepared (a). A film is formed (b) by applying the coating solution onto a substrate, for example, by a die coating method to obtain a gel film (c). Thereafter, the obtained gel film is subjected to calcining as a primary heat treatment, and an organic substance is decomposed (d) to obtain a calcined film (e). Furthermore, this calcined film is subjected to firing as a secondary heat treatment (f), and then is subjected to, for example, pure oxygen annealing (h) to obtain a superconductor film (h).

Figure 7:
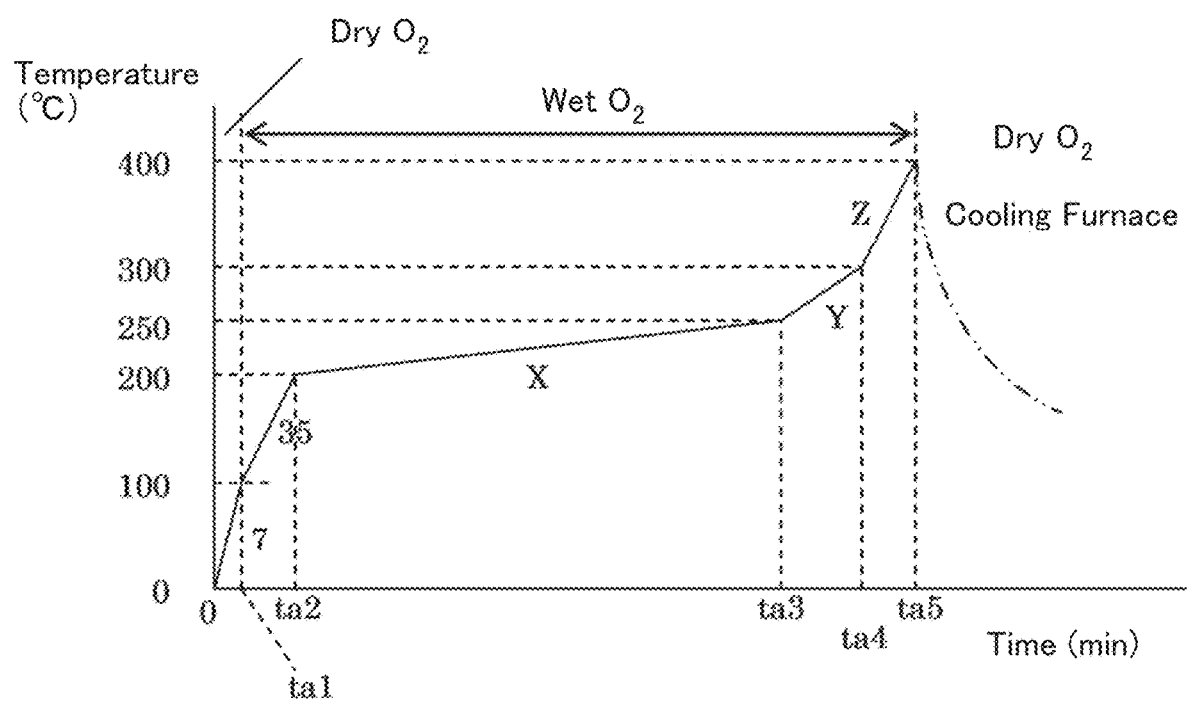
FIG. 7 is a graph illustrating a typical calcining profile according to the embodiment.

FIG. 7 is a diagram illustrating a typical calcining profile according to the present embodiment. Calcining under normal pressure decomposes a trifluoroacetate mainly at 200° C. or higher and 250° C. or lower. In order to prevent the temperature from entering the region, a temperature-rising rate is reduced around 200° C. By gradually raising the temperature to 250° C., a substance decomposed from the trifluoroacetate contains fluorine or oxygen, which easily remains in the film due to a hydrogen bond. The temperature is raised to 400° C. in order to remove the substance. A final temperature is generally from 350 to 450° C. In this way, a semitransparent brown calcined film formed of an oxide or a fluoride is obtained.

Figure 8:
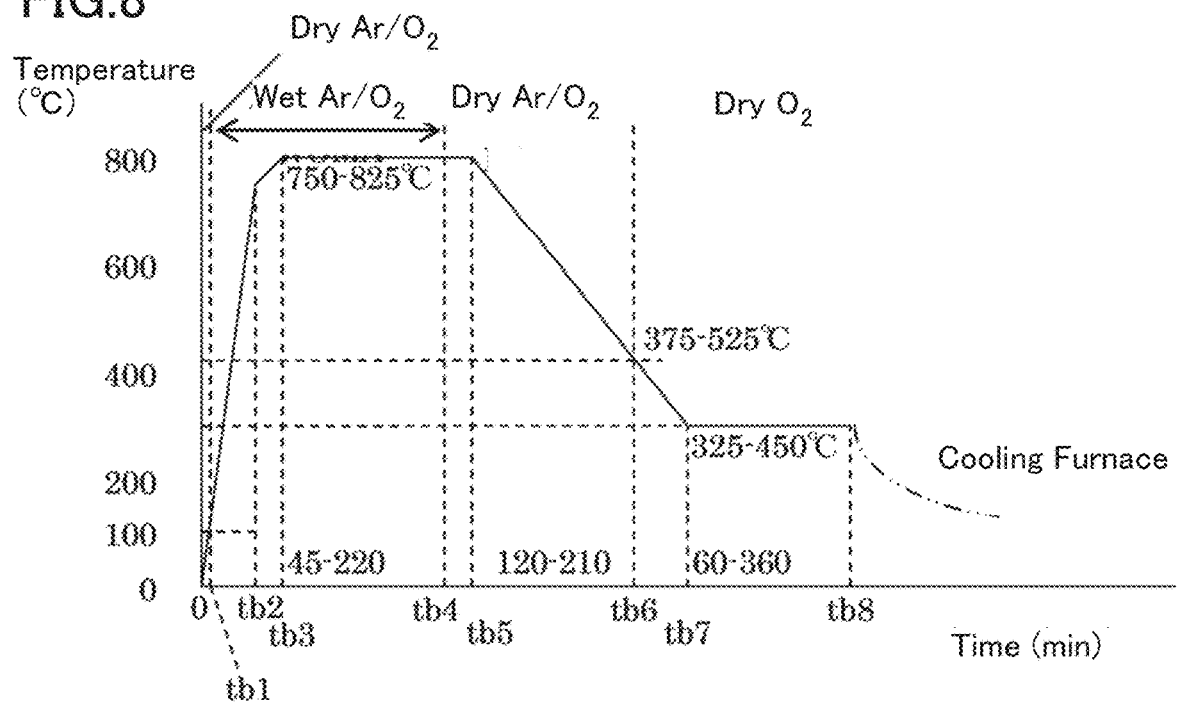
FIG. 8 is a graph illustrating a typical firing profile according to the embodiment.

FIG. 8 is a diagram illustrating a typical firing profile according to the present embodiment. Until tb1 at 100° C., a dry mixed gas is used. However, subsequently, humidification is performed. A humidification starting temperature may be 100° C. or higher and 400° C. or lower. It is considered that formation of a pseudo-liquid layer starts around 550° C. Humidification is performed at a temperature of 550° C. or lower such that a pseudo-liquid layer is uniformly formed while a humidified gas is spread in the film.

FIG. 8 illustrates a typical temperature profile of firing at 800° C. The profile is a gradual temperature-rising profile at 775° C. or higher and 800° C. or lower such that temperature overshoot at tb3 does not occur. Even in this profile, overshoot of 2 to 3° C. may remain at 800° C., but does not cause a particular problem. An oxygen partial pressure at a maximum temperature depends on a parent phase. In a case of firing of a YBCO superconductor, an optimal oxygen partial pressure is 1000 ppm at 800° C., and becomes half whenever the temperature is lowered by 25° C. therefrom. That is, the optimal oxygen partial pressure is 500 ppm at 775° C., and is 250 ppm at 750° C., In this firing, a YBCO-based material forms $YBa_2Cu_3O_6$. At this time, the YBCO-based material is not a superconductor.

In firing at the maximum temperature, a dry gas is caused to flow at tb4 before the temperature starts to be lowered after completion of firing. A humidified gas decomposes a superconductor to generate an oxide at 700° C. or lower, and therefore oxygen annealing is performed at tb6, and the number of oxygen atoms in the superconductor is changed from 6.00 to 6.93. The material becomes a superconductor at this number of oxygen atoms. However, only PrBCO is not a superconductor although having a perovskite structure. The valence of Pr is unknown, and therefore the number of oxygen atoms in a unit cell is also unknown, but the number of oxygen atoms is considered to be large. This is because the valence of Pr is between three and four and the number of oxygen atoms is increased in accordance therewith in a unit cell. An oxygen annealing starting temperature is 375° C. or higher and 525° C. or lower. Subsequently, the temperature is maintained, and then a furnace is cooled from tb8.

By the above manufacturing method, the oxide superconductor 100 containing the oxide superconducting layer 30 according to the present embodiment is manufactured.

Next, a function and an effect of the oxide superconductor 100 according to the present embodiment is described.

in the oxide superconductor 100 according to the present embodiment, by introducing PrBCO which is a non-superconductor into the oxide superconducting layer 30 as an atomic level artificial pin, magnetic field characteristics are improved. Furthermore, according to the method for manufacturing the oxide superconductor 100 according to the present embodiment, PrBCO which is a non-superconductor can be introduced in the oxide superconducting layer 30 as an atomic level artificial pin, and the oxide superconductor 100 having magnetic field characteristics improved can be manufactured.

As described above, an artificial pin is sometimes introduced in order to improve magnetic field characteristics of a superconducting wire material, for example, in a PLD method. This is an attempt to introduce, for example, BZO which is a non-superconductor in a superconductor and to fix a magnetic flux to that portion, that is, to pin the magnetic flux thereto.

However, the superconductor having BZO formed therein lowers Tc. A YBCO superconductor having BZO introduced therein in an amount of about 5% may have Tc of 89.0 K, but the drop in Tc is not necessarily constant. If a YBCO superconductor having BZO introduced therein is applied to a coil, even in design of 10 T, for example, only a 7 T magnetic field can be manufactured in some cases. A reason for a smaller magnetic field than design is considered as follows.

A superconducting wire material having Tc of 89.0 K indicates that Tc is 89.0 K at a place having the lowest Tc when a current flows through both ends of the superconducting wire material. The superconducting wire material is observed from above (c axis of a YBCO superconductor), a current direction is assumed to be an X axis, and a direction perpendicular to the current direction is assumed to be a Y axis. For explanation, the X axis direction is divided into 100, and the Y axis direction is divided into 10. Discussion is made with coordinates (X, Y) (X: 1 to 100, Y: 1 to 10).

A wire material having Tc of 90.7 K means that, for any X, Y obtained by division into 10 necessarily has a region of 90.7 K which is the highest Tc and that the region is connected at both ends of the wire material. For example, for a superconducting film manufactured by a TFA-MOD method with a good critical current density (Jc) value of 7 MA/cm$^2$ (77 K,0 T) on a single crystal substrate, a Tc value Is 90.7 K in any (X, Y).

Here, an inside of a wire material having Tc of 89.0 K considered. This wire material has a bottleneck portion of Tc which is 89.0 K. For example, it is assumed that the bottleneck portion is present at (35, 7) in (X, Y) coordinates. At a position of X=35, Tc values at places where Y is not 7 are all 89.0 K or less. YBCO at (35, 7) which should originally have Tc of 90.7 K is degraded such that Tc becomes 89.0 K for some reasons, but the degradation amount thereof is not uniform. Particularly in a case of adding BZO, there has been no report that an inside is uniform. Therefore, there is almost no possibility that Tc is 89.0 K in another part at X=35. In parts other than Y=7 at X=35, it seems that there is a part where Tc is lowered to 86 K, 87 K, or the like.

It has been assumed that the entire superconducting wire has Tc of 89.0 K. However, when Tc is viewed at X other than the bottleneck X=35, a possibility that Tc of another part is maintained at 90.7 K is very low. At a position of X=35, Tc is 89.0 K at Y=7, and Tc is lower at Y other than 7 as described above. There are many places where Tc is low at X=35, and it is difficult to consider that Tc is 90.7 K in all other parts.

It is predicted that there is a part where Tc is 89.1 K or 89.2 K as a maximum Tc at each X. A YBCO superconducting structure in which an artificial pin such as BZO has been introduced is discontinuous, and it is considered that Tc depends on an interface thereof. Even when Tc of the entire region is 89.0 K, it is predicted that there are many regions of X having Tc of 89.1 K or 89.2 K.

Here, at X=38, it is assumed that a Tc value is 89.1 K. A maximum Tc value is 89.1 K at X=38, but there is a high possibility that a Tc value is lower in parts other than Tc=89.1 K. In a region where Tc is higher in the same superconducting wire, there are many cases where characteristics during cooling are higher than the other regions. If a value close to a rated current value of a superconducting wire material flows, a larger amount of current flows in a portion of a maximum Tc at each X.

Supposing that Tc is 89.1 K in a region of X=38 and Y=1 and Tc is lower in the other regions, a current mainly flows through a part at Y=7 in the part of X=35, and therefore a superconducting current meanders. When the current meanders, heat generation occurs at a current value lower than a designed value due to reaching a Jc value, or a risk of quenching increases.

For example, a point B is located at a place straight from a point A in an a-axis direction, and a current capacity thereof is 100 A. If the current flows straight, there is no problem. However, in a case where the current meanders in a direction of 45 degrees from the point A, is bent by 45 degrees, returns to an original position, and reaches the point B, a current value flowing in the a-axis direction is 71 A. This is because an Ic value is 100 A and Ic has been reached at the time when a current of 71 A flows in the a-axis direction.

If a current is forced to flow from that state, naturally, a coil is quenched and is easily broken. In addition, it is considered that a magnetic field obtained from a current of 71 A is also generated as a magnetic field. if it is tried to generate a magnetic field of 71% or more of a designed value, it seems that the coil will be quenched and broken. This model is consistent with a phenomenon of a coil that has been reported in the past.

From the above discussion, a situation at the time of coil application is largely different between a Y-based superconducting wire material having Tc of 90.7 K as a theoretical value and a Y type superconducting wire material having Tc of 89.0 K slightly lower than 90.7 K. An operating temperature is 30 K. Therefore, it can be considered that the above-described two Tc values have a slight difference of ΔTc between 60.7 K and 59.0 K. However, the meaning differs largely depending on presence or absence of meandering of a superconducting current.

Even in use at 30 K, if a superconducting current close to a rated current flows, a superconducting current flows around a region having a high Tc. Also in this case, it is predicted that meandering will occurs and a generated magnetic field will be reduced. In manufacturing a coil at present, it is considered that internal nonuniformity is one of reasons why a predetermined magnetic field is not generated. It is considered that a homogeneous superconductor or a superconductor having Tc maintained is necessary for prevention thereof. Of course, even if Tc is lowered, there is a possibility that there is no problem if an inside is homogeneous.

At present, a substance used as an artificial pin in a YBCO superconducting wire material is roughly classified into two types. These are a $Dy_2O_3$ type growing independently without a correlation with a perovskite structure and a BZO type having an influence on a perovskite structure and having a relatively small artificial pin.

In the $Dy_2O_3$ type substance having no influence on a perovskite structure, the size is grown significantly particularly in a method starting from a homogeneous calcined film like a TFA-MOD method. In firing at 725° C. or higher, the size of $Dy_2O_3$ is 20 to 30 nm by sintering. It is considered that an artificial pin preferably has a size of 3 nm, and the size of 30 nm is 10 times the size of 3 nm in diameter.

With a 30 nm artificial pin, the volume is 1000 times a target size of 3 nm. The number of artificial pins formed per input material amount is 1/1000, and an effect of improving magnetic field characteristics is drastically reduced. In addition, a pinning force to fix a magnetic flux is generated only at an interface between a superconducting layer and a non-superconducting layer. Therefore, if the artificial pin size is large and there are many quantum magnetic fluxes inside, a Lorentz force works on each of the quantum magnetic fluxes, and the magnetic fluxes easily break through the interface. An effect of a large size artificial pin is poor. Therefore, it is considered that a $Dy_2O_3$ type artificial pin has an extremely small effect of improving magnetic field characteristics.

A BZO type is used because of easily suppressing an artificial pin size. There are many reports on addition of BZO having a perovskite structure as an artificial pin. BZO grows with a correlation with YBCO. Therefore, BZO does not become a large size like $Dy_2O_3$ and can be formed into an artificial pin with a minimum width of 6 nm. However, it seems that an average artificial pin size can be only about 10 nm.

A BZO type artificial pin does not have a close lattice constant to YBCO such that the same perovskite structure as YBCO can be formed, and it is said that there is 9% lattice mismatch. Therefore, it is considered that it is difficult for BZO and YBCO to have a common perovskite structure with YBCO with a BZO artificial pin.

If a BZO artificial pin has a width of 10 nm, by arrangement of 25 unit cells each having a width of 0.4 nm with YBCO, BZO is shifted by two unit cells. From TEM observation, YBCO and BZO are observed clearly separately. The BZO type artificial pin separated from YBCO is accumulated even with 1 vol %, a discontinuous plane is formed at a YBCO grain boundary, and Tc is lowered. In order to exhibit an effect of an artificial pin, the addition amount is often 5% or more. However, in this case, a Tc value is lowered. In a case of a long length, the smallest Tc value is a Tc of a wire material, and therefore the Tc is further lowered.

In addition, the BZO type artificial pin extracts an oxygen atom from a YBCO unit cell. It is considered that the Tc is also lowered by the effect. Therefore, it is considered that lowering in Tc cannot be avoided in forming the BZO type artificial pin.

A superconducting wire material maintaining Tc and having magnetic field characteristics improved is required for coil application. However, the $Dy_2O_3$ type has a small effect of an artificial pin, and the BZO type has an unstable Tc and an insufficient magnetic field when being formed into a coil, and is easily quenched.

In order to solve this problem, a structure a part of which is a non-superconductor while maintaining a perovskite structure of a YBCO superconductor is desirable. If the perovskite structure is maintained at both ends of a superconducting wire material, Tc is maintained at 90.7 K. If an artificial pin can be formed in the perovskite structure, magnetic field characteristics are also improved. It is considered that a coil in which a superconducting current flows without being bypassed inside and which stably generates a magnetic field can be manufactured.

A unit cell maintaining a perovskite structure of REBCO and becoming a non-superconductor as an artificial pin is only PrBCO. Therefore, it is considered that a unit cell of PrBCO is desirably dispersed and formed inside a superconductor of REBCO. PrBCO has trivalent Pr around 800° C. when a perovskite structure is formed, and has high consistency with a superconductor such as YBCO.

It is difficult to manufacture a structure in which a unit cell of PrBCO is dispersed inside a superconductor of REBCO by a physical vapor deposition method. Stoichiometry cannot be strictly controlled by the physical vapor deposition method in the first place, and composition deviation of several % occurs everywhere. It is difficult to consider a reason why only a part of a perovskite structure can be formed of PrBCO and other adjacent unit cells can be formed of YBCO. Therefore, even when PrBCO can be formed, there is a high possibility that PrBCO is unevenly distributed. An oxygen partial pressure ($p(O_2)$) forming a perovskite structure is also 1000 ppm for YBCO. It is considered that $p(O_2)$ is 1 ppm for PrBCO if the oxygen partial pressure is estimated from NdBCO. From this difference in ($p(O_2)$), it seems difficult to simultaneously form TBCO and PrBCO.

In a case where a film of PrBCO is formed in the coexistence of YBCO by a sputtering method which is a physical vapor deposition method like a PLD method, Tc is lowered by 4 K by adding 10% PrBCO. In addition, it is considered that PrBCO is unevenly distributed in a form not incorporating a perovskite structure. From this fact, it is considered that it is difficult to form YBCO and PrBCO in the same crystal by the physical vapor deposition method.

It is predicted that a physical vapor deposition method other than a sputtering method will bring almost the same results. It seems that both the sputtering method and the PID method form a film by flying of discrete elements. Therefore, control of an oxygen partial pressure is strictly required. It is almost impossible to simultaneously form a film using substances having different optimum oxygen partial pressures from each other by 1000 times. A MOCVD method is also considered to be almost similar. This method also decomposes an organic substance after a metal element comes to a substrate. At the time of film formation, necessary oxygen partial pressures of YBCO and PrBCO seem to be 1000 ppm and 1 ppm at 800° C., respectively. It is easy to imagine that it is difficult to form a film in coexistence thereof.

An attempt to improve magnetic field characteristics by forming YBCO+PrBCO in a bulk body has also been reported. However, this has also reported a result that a Tc has been largely lowered. It is considered that this is caused by a fact that a lattice constant of a PrBCO assembly is reduced by 12 to 14% when each of PrBCO and YBCO is formed as an assembly and the valence of Pr is changed from three to about four by a succeeding valance change of Pr, and an adjacent condition to a YBCO assembly is degraded. In addition, a Tc is also lowered by generating a gap between YBCO particles each having about 1 μm for change in size of PrBCO. In other words, the report in a bulk body indicates that unit cells of YBCO and PrBCO indicated in the present embodiment cannot form the same perovskite structure.

As for the superconductor to lower a Tc, reported in the bulk body, internal current meandering occurs, and therefore a magnetic field as designed is not formed. It is predicted that a wire material for a coil will be easily quenched.

In the TFA-MOD method, it is possible to form a plurality of REBCOs into a single perovskite structure. This is because it is possible to manufacture a superconductor having a single perovskite structure while a plurality of elements is present at a Y site with the same lattice constant by forming a high purity solution and then performing mixing at an arbitrary ratio.

However, this is possible in a case of elements with a small atomic radius difference such as Tm and Dy. In addition, a Tc in this case is an intermediate value between the two mixed superconductors, and a single peak having a lattice length of an intermediate value is also observed from a XRD measurement result. This is a result that substances having different atomic radii form the same perovskite structure, a lattice constant is an intermediate value, and a Tc value is also an intermediate value.

A unit cell forming a perovskite structure with a lattice constant close to REBCO as a superconductor and capable of becoming an artificial pin is only PrBCO. However, Pr has a large atomic radius and is easily separated. Therefore, solution synthesis thereof is difficult. PrBCO has been considered to be a non-superconducting material since long ago. However, if PrBCO is a superconductor only with a low Tc, it is difficult to apply PrBCO at 30 K and 5 T used in coil application. It is necessary to confirm directly or indirectly that PrBCO is not a superconductor only with a low Tc.

In order to manufacture a superconductor having a single perovskite structure including PrBCO, for example, a solution in a mixed state containing a stable parent phase such as YBCO and an element to be a raw material of PrBCO needs to be highly purified. Of RE, each of La, Nd, and Sm has a large atomic radius, and easily causes an esterification reaction which is a decomposition reaction. In order to suppress the esterification reaction, PFP having the larger number of carbon atoms than TFA has been used. However, TFA and PFP are largely different in polarity, are easily separated, and lower internal homogeneity. Therefore, La, Nd, or Sm cannot be used as a parent phase in the current technology.

Even if YBCO or the like is used as a parent phase, it is difficult to synthesize and purify a PrBCO solution. The atomic radius of Pr is between La and Nd. Therefore, an esterification reaction easily occurs during solution synthesis, and a TFA salt cannot be easily formed. Even when PFP is used, only Sm can obtain a Tc close to a theoretical value. In a case of Nd, a result of about 93.6 K is often obtained with respect to a theoretical value of 96.0 K. This is because Nd has a larger ionic radius than Sm, is easily decomposed, and cannot be subjected to purification for increasing purity of a solution. It can be easily estimated that Pr having a larger atomic radius than Nd will bring about a worse result than Nd. However, there is no achievement result that a high purity salt could be formed with PFP.

As described above, in coil application of a superconducting wire material, it seems that a structure maintaining a perovskite structure and including an artificial pin is good. However, it is necessary to prepare a solution for realizing the structure, particularly a methanol solution containing a Pr-TFA salt with a small amount of impurities. The inventors considered that a superconductor suitable for coil application could be obtained as long as the solution could be obtained. In addition, the inventors considered that it was necessary to confirm that obtained PrBCO exhibited an effect as an artificial pin.

In the manufacturing method according to the present embodiment, instead of a coating solution for PrBCO which is difficult to form alone, a coating solution for PrBCO is prepared in such a way that the solution is partially replaced with a coating solution with REBCO that can be stably formed as a parent phase. The amount is the element amount entering a Y site and is the amount of Pr at 20 atomic % or less.

Furthermore, impurities of the PrBCO coating solution are reduced by a SIG method. The SIG method is a method for highly purifying a solution to be partially stabilized for preventing decomposition of PrBCO, and is a partially stabilized solvent-into-gel (PS-SIG) method.

By firing the highly purified coating solution under optimum conditions of REBCO as a parent phase, a single crystal having a perovskite structure in which REBCO as a parent phase and PrBCO are constituted by the same unit cell is obtained. A single crystal having a perovskite structure containing an atomic level artificial pin is obtained.

In the manufacturing method according to the present embodiment, a PrBCO coating solution can be partially formed without being decomposed. The inventors used TFA, PFP, longer chain HFB, and the like in order to synthesize a PrBCO solution which was expected to be an artificial pin and was an object of envy. However, the inventors had known that decomposition would easily occur under various conditions. When purification conditions were relaxed, a large amount of impurities were present. A symptom indicating formation of a PrBCO unit cell could not be obtained in a film formed from the coating solution.

Pr has a large atomic radius as an ion, and therefore it is predicted that Pr will easily cause an esterification reaction and decomposition. Therefore, it was initially predicted that decomposition would occur even if a coating solution for YBCO was mixed and a solution was prepared. However, in the present embodiment, on the contrary, in a solution having YBCO as a parent phase, decomposition is suppressed according to a mixing ratio, and PrBCO actually forms a unit cell to exhibit an effect as an artificial pin.

Concerning what happens when YBCO and PrBCO are mixed to prepare a solution, it seems that esterification conditions are averaged because Y and Pr surrounded by three trifluoroacetic acid groups which are possibly large ligands have similar structures to each other. Even under a condition under which Pr-TFA should be decomposed originally, it seems that a homogeneous mixed state is formed by a strong hydrogen bond due to close proximity of a Y-TFA salt. It is predicted that decomposition conditions correspond to a mixing ratio between Y and Pr. Therefore, it seems that a single perovskite structure can be formed even if 20% Pr is added to YBCO.

In the manufacturing method according to the present embodiment, purification is performed such that the total weight of residual water and residual acetic acid in a coating solution is 2 wt % or less. When the total weight of residual water and residual acetic acid is more than 2 wt %, improvement of magnetic field characteristics cannot be realized.

When impurities such as water and acetic acid are present, it seems that $Pr_2O_3$ or the like is formed starting from the impurities. In this case, PrBCO is unevenly distributed, a structure adjacent to YBCO cannot be formed, and Rp described later is a value close to 1. That is, it does not seem that an effect as an artificial pin can be exhibited. From this fact, it is considered that it is necessary to reduce the amount of water or acetic acid in a solution in order to form a unit cell such that Pr which is easily decomposed is incorporated in a parent phase such as YBCO.

Figure 9:
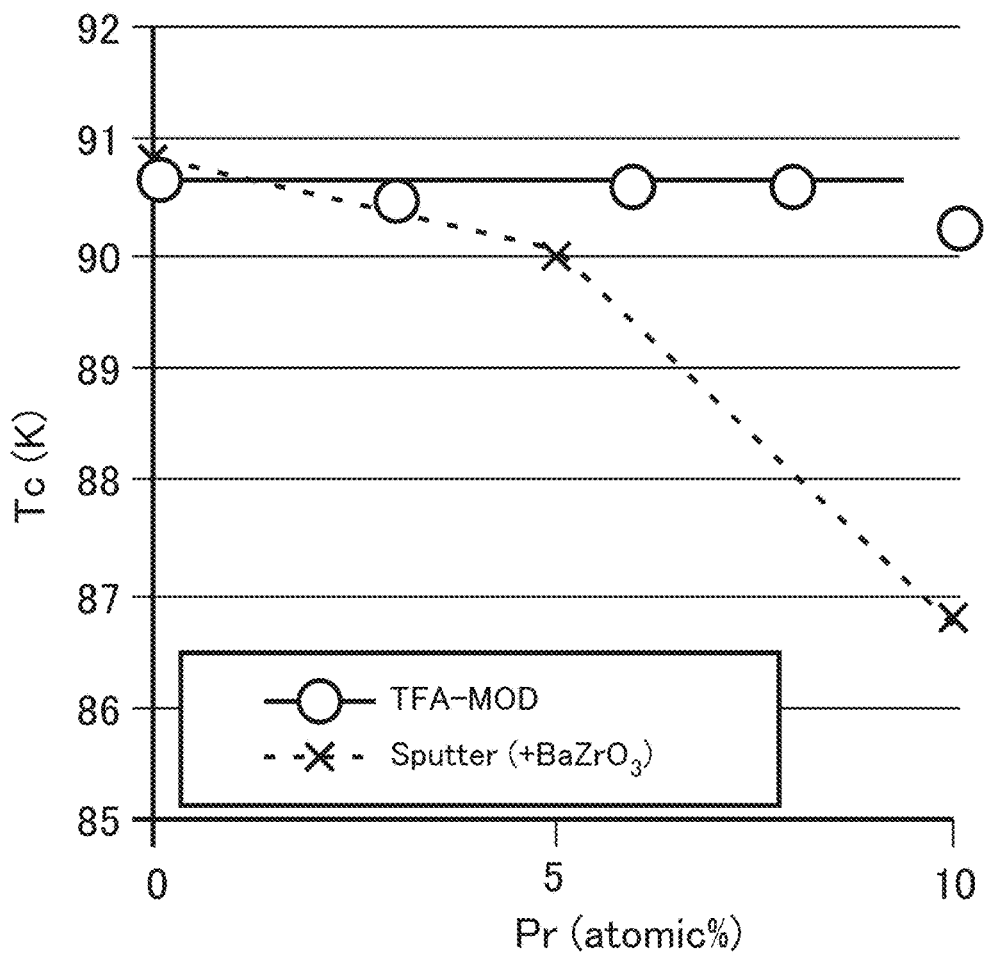
FIG. 9 is a graph illustrating a relationship between the amount of Pr and a superconducting transition temperature value in the oxide superconductor according to the embodiment.

FIG. 9 is a graph illustrating a relationship between the amount of Pr and a superconducting transition temperature (Tc) value in the oxide superconductor according to the present embodiment. Up to 8% of the amount of Pr, a Tc value is ±0.2 K and hardly changes. It seems that Tc is slightly lowered when the amount of Pr is 10%. When the amount of Pr is 10%, 50% of the total should be artificial pins due to 5-times degradation as described later, and it seems that a Tc is lowered by many artificial pins.

A cross and a broken line in FIG. 9 exemplify characteristics of a superconductor a film of which has been formed by a PLD method. The addition amount indicates not the amount of Pr but the amount of $BaZrO_3$. A Tc is lowered with the addition amount.

FIG. 9 indicates that a Tc is maintained even when PrBCO is contained inside. This indicates that a perovskite structure is maintained throughout a film. That is, it is indicated that a YBCO superconductor is present in a connected state at both ends of the superconductor, and that a structure of YBCO is not cut because PrBCO is incorporated inside and is present in a ultimate dispersion state.

Figure 10:
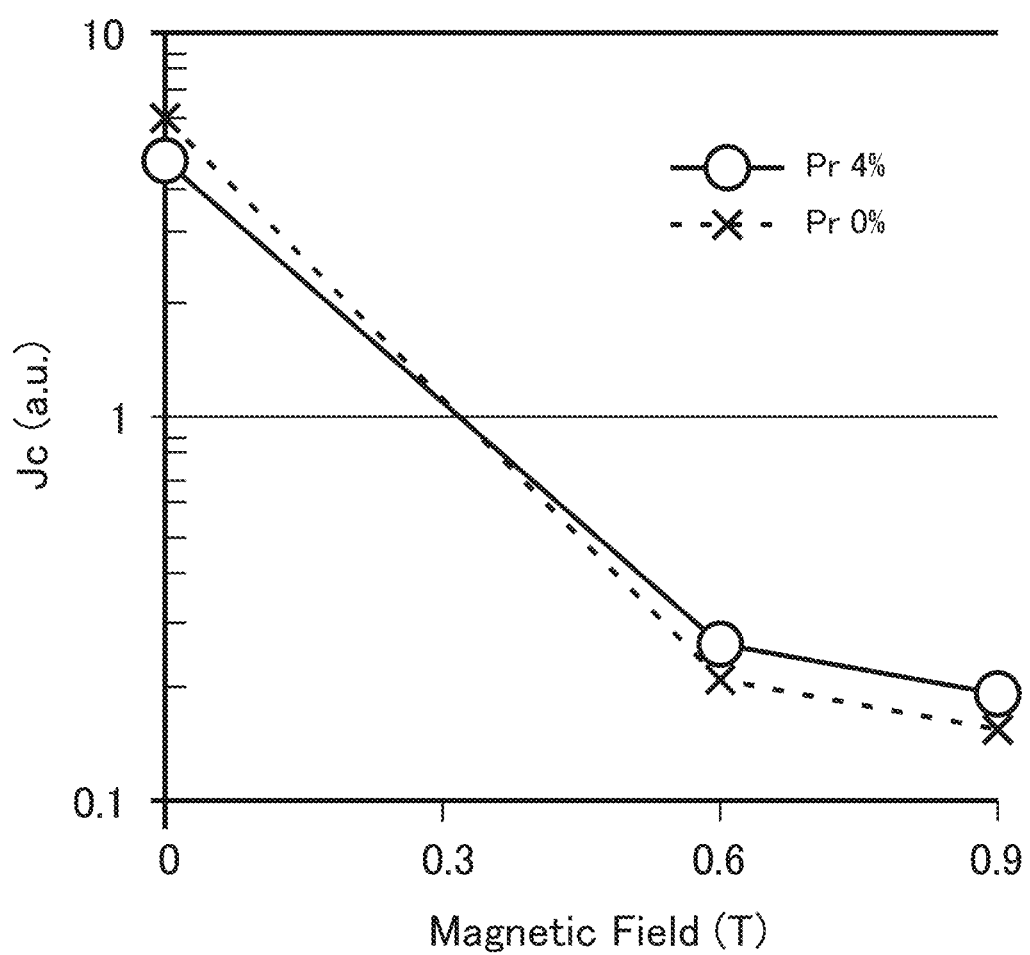
FIG. 10 is a graph illustrating a relationship between a magnetic field and a critical current density in the oxide superconductor according to the embodiment.

FIG. 10 is a graph illustrating a relationship between a magnetic field (B) and a critical current density (Jc) in the oxide superconductor according to the present embodiment. A Jc value is a measurement result by an induction method in liquid nitrogen.

Measurement results of a YBCO film of 0% Pr and a YBCO film mixed with 4% Pr, formed by a TFA-MOD method, are illustrated. In the superconducting film in which 4% Pr artificial pins are introduced, characteristics are lower by about 20% due to 5-times degradation as described later at 0 T. However, the characteristics are improved with a magnetic field, and conversely the characteristics are higher at 0.9 T. When normalization is performed with zero magnetic field, characteristics are improved by 54% due to an effect of artificial pins.

FIG. 10 indicates that an atomic level artificial pin was formed with a PrBCO unit cell. When Pr is introduced, a Jc value with zero magnetic field is lowered because the Jc value is lowered due to presence of an artificial pin. The characteristics are reversed at 0.9 T. It can be confirmed that the degree of reduction from a numerical value at zero magnetic field has a characteristic improvement effect of 54% in total as compared with a case where Pr is not added.

A molar ratio of praseodymium with respect to the sum of the rare earth element and praseodymium in the oxide superconducting layer 30 is 0.00000001 (10 ppb) or more and 0.2 (20%) or less. The molar ratio of praseodymium with respect to the sum of the rare earth element and praseodymium is desirably 0.000001 (1 ppm) or more and 0.05 (5%) or less. The molar ratio of praseodymium with respect to the sum of the rare earth element and praseodymium is, for example, more desirably 0.001 (0.1%) or more and 0.02 (2%) or less. If the molar ratio is lower than the above range, the magnetic field characteristic improvement effect by an artificial pin may be insufficient. If the molar ratio is higher than the above range, superconducting characteristics may be degraded.

Figure 11:
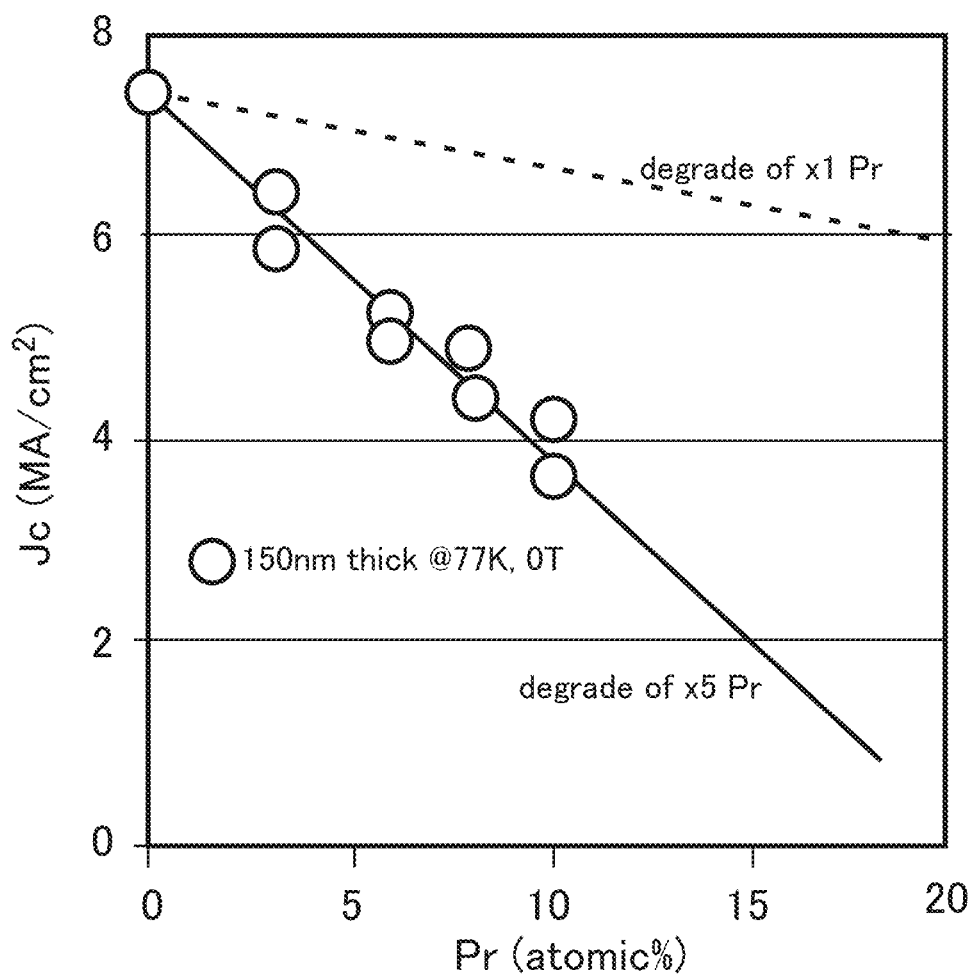
FIG. 11 is a graph illustrating a relationship between the amount of Pr and a critical current density in the oxide superconductor according to the embodiment.

FIG. 11 is a graph illustrating a relationship between the amount of Pr and a critical current density (Jc) in the oxide superconductor according to the present embodiment. FIG. 11 is a graph illustrating reduction in the amount of Pr entering a Y site and reduction in a Jc value in a film in which PrBCO is added to YBCO. A Jc value is a measurement result by an induction method in liquid nitrogen. The dotted line in FIG. 11 is a line indicating Jc degradation at 1 time the addition amount of Pr, and the solid line is a line corresponding to about 5-times degradation of the amount of Pr.

FIG. 11 indicates that an artificial pin was formed in proportion to the introduction amount of PrBCO and the Jc value was lowered. The reduction in the Jc value is not 1 time but 5 times the amount of Pr. It is considered that four YBCO unit cells adjacent to each other in an a/b plane and two YBCO unit cells in a c-axis direction become non-superconducting due to an influence of lattice distortion of a PrBCO unit cell. When a current flows in an a-axis direction, a superconducting current of 5 times the area of PrBCO is obstructed, and therefore it seems that 5 times degradation has occurred.

In the oxide superconductor according to the present embodiment, as illustrated in FIG. 4, if the content of Pr is 10%, the c-axis length is shortened by about 1%. If Pr is trivalent, Pr should have a large ionic radius and a long c-axis length. However, Pr is tetravalent, the number of oxygen atoms in a perovskite structure increases from 6.93 to 7.43 in simple calculation. In this case, an oxygen atom is present in a place where an oxygen atom was deficient, and an attractive force due to a Coulomb force with a metal element works. It is predicted that the c-axis length will be shortened. The above phenomenon is considered as a background of a fact that the c-axis length is shortened with an increase in the amount of Pr. In addition, it seems that the change causes PrBCO to become non-superconducting while PrBCO maintains a perovskite structure.

The lattice length of PrBCO is different from that of YBCO. Therefore, if only PrBCO is accumulated, accumulated PrBCO may be observed in a cross-sectional TEM observation image as in a case of adding a BZO artificial pin. However, in the present embodiment, as illustrated in FIG. 2, accumulated PrBCO cannot be confirmed. If PrBCO is present as an assembly, it seems that the assembly is detected by a diffraction result in XRD measurement, but the assembly is not detected as illustrated in FIG. 3. From this fact, it is considered that PrBCO is incorporated in a lattice structure of YBCO in a dispersed form and that the lattice length thereof becomes close to that of YBCO which is a parent phase.

PrBCO seems to be trivalent when forming a perovskite structure. Therefore, YBCO and PrBCO form a perovskite structure and form a common lattice structure. However, this does not apply if impurities are included in the solution. Pr is a substance having a large ionic radius and inherently very easily decomposed.

When residual water or acetic acid is present in a coating solution at the time of manufacturing, PrBCO and $Pr_2O_3$ as a decomposition product are formed starting from water or acetic acid. In a film obtained from the solution, a 5-times degradation phenomenon of the amount of Pr added and a Jc-B improvement effect are not observed. It seems that a Pr component is unevenly distributed in another place without forming a perovskite structure.

Meanwhile, it is considered that a structure where YBCO and PrBCO are adjacent to each other is formed from a highly purified solution. It is considered that this is an effect of reduction in impurities, caused by occurrence of a situation in which a perovskite structure has to be formed in such a manner that YBCO and PrBCO are adjacent to each other.

In a case where YBCO and PrBCO are coincidentally obtained in coexistence in a bulk body and PrBCO thus formed is ideally adjacent to YBCO, how many unit cells are adjacent is calculated. In the first place, there are reported examples in which YBCO and SmBCO are formed in coexistence. However, PrBCO and YBCO are considered to have optimum oxygen partial pressures of 1 ppm and 1000 ppm, respectively. In addition, there is a high possibility that PrBCO and YBCO cannot be formed in coexistence in the first place. A volume ratio at which PrBCO can be adjacent to REBCO is calculated on the assumption that YBCO and PrBCO are formed in coexistence based on a result in which YBCO and SmBCO are formed in coexistence.

Calculation in a bulk body is performed on the assumption that SmBCO is formed in a region of 1 μm square, that is, 1000 nm square, and YBCO is ideally adjacent in all six planes. The unit cell size is about 0.4 nm for an a/b axis and about 1.2 nm for a c-axis. Therefore, the unit cell number is easily calculated. The number of unit cells in contact with each other is different between upper and lower sides and a peripheral portion, but can be easily calculated. The ratio is 0.41 vol %.

Similarly, when calculation is performed for a case where an assembly of SmBCO is formed in a smaller region in a bulk, adjacent REBCO is calculated to be 0.82 vol % in 500 nm square and 2.02 vol % in 200 nm square. These values are calculated on the assumption of being adjacent in a really ideal state, and these values do not seem to be obtained actually. However, an adjacent volume ratio of PrBCO and REBCO) obtained in the present embodiment is estimated to be 0.5 vol %, 1.0 vol %, or more than 2.5 vol %. In the present embodiment, a unit cell of PrBCO is dispersed and is present in a perovskite structure. Therefore, it seems that an adjacent volume ratio is 80 vol % or more as a real number.

Therefore, in a single crystal contained in the oxide superconducting layer 30 according to the present embodiment, a ratio of a unit cell containing yttrium is considered to be, for example, 0.0050 (0.50 vol %) or more with respect to all the unit cells that can be adjacent to a unit cell containing praseodymium. The ratio of a unit cell containing yttrium with respect to all the unit cells that can be adjacent to a unit cell containing praseodymium is desirably, for example, 0.010 (1.0 vol %) or more in the single crystal from a viewpoint of further improving magnetic field characteristics. Furthermore, the ratio of a unit cell containing yttrium with respect to all the unit cells that can be adjacent to a unit cell containing praseodymium is more desirably, for example, 0.025 (2.5 vol %) or more in the single crystal.

The TFA-MOD method has mass production achievement result and is expected to be industrially applied. However, it has been considered that it is difficult to form an artificial pin by the TFA-MOD method up to now. However, a solution is synthesized by avoiding an esterification reaction in a partially stabilized form together with YBCO and the like, the solution is further purified to obtain a coating solution, and it has become possible to form a parent phase such as YBCO and a PrBCO artificial pin from the coating solution. In addition, an obtained wire material hardly lowers a Tc.

A partially stabilized SIG method, that is, a PS-SIG method provides a solution containing Pr-TFA in the TFA-MOD method, and realizes an oxide superconductor for improving magnetic field characteristics. It seems that majority of unit cells are not adjacent to each other in REBCO and YBCO manufactured by a method other than the embodiment. It is considered that 2 vol % volume of adjacency exists at maximum in ideal calculation even when PrBCO and REBCO are adjacent to each other. However, in the present embodiment, it is considered that 3% or more, probably 50% or more PrBCO and REBCO of are adjacent to each other. Improvement in magnetic field characteristics seems to be realized.

The result illustrated in FIG. 11 is a result that Jc is proportional to 5 times the amount of Pr input. It is known that a unit cell containing Pr is not all the time conducting. However, when an adjacent superconducting unit cell YBCO maintaining a perovskite structure is distorted, what kind of phenomenon occurs is not necessarily clear. From the result illustrated in FIG. 11, it is considered that cells up to a first adjacent cell of a unit cell containing Pr become non-superconducting.

In the present embodiment, in a PrBCO unit cell, PrBCO can form a perovskite structure together with YBCO at 800° C. during firing and can be uniformly dispersed. This is considered to be indirect evidence indicating that Pr is present as $Pr^{3+}$. However, a c-axis length is shortened by cooling. This is considered to be evidence indicating that an oxygen atom in the unit cell is increased and the oxygen atom is buried in an oxygen site between Cu atoms of low oxygen occupancy, and a strong Coulomb force thereby acts on Cu—O—Cu to shorten the c-axis length.

FIG. 4 illustrates a relationship between the amount of Pr at a Y site and a measured value of the c-axis length in (Y, Pr)BCO. A unit cell of PrBCO should have a large lattice constant and a long c-axis length in a case where Pr is trivalent. On the contrary, the result of FIG. 4 illustrates that as the amount of Pr increases, the c-axis length becomes shorter.

It is known that Pr is trivalent to tetravalent. However, after a perovskite structure is formed at 800° C. during firing, it is predicted that the valence of Pr is increased to, for example, $Pr^{4+}$, or $Pr^{3.5+}$ even if Pr does not become tetravalent, after Pr is cooled to ambient temperature. In this case, the number of oxygen atoms in a unit cell of PrBCO seems to change. If Pr is $Pr^{4.0+}$, in a case where the number of divalent oxygen atoms in a unit cell is 6.93, the number of oxygen atoms increases to 7.43.

In the sample mixed with 10% Pr in FIG. 4, it seems that a reason why the c-axis length has become shorter is an increase an the valence of Pr. As illustrated an FIG. 11, a Jc is degraded five times the amount of Pr input. However, in combination with the result in FIG. 4, a model in which Pr is a non-superconducting unit cell to form an artificial pin can be predicted.

It seems that there are main two reasons why Pr becomes non-superconducting. One is an increase in the number of oxygen atoms due to a change in valence. The other is that a Cu—O plane on which a superconducting current is obtained is distorted by a change in the lattice constant or superconductivity disappears due to inhibition of cooper pair formation. First, the change in the number of oxygen atoms due to a change in valence will be examined.

In a PrBCO unit cell, it is assumed that Pr has changed from trivalent to completely tetravalent, and the number of oxygen atoms in a unit cell has changed from 6.93 to 7.43. A superconductor exhibits the best superconducting characteristics when the number of oxygen atoms is 6.93. However, when the number of oxygen atoms increases or decreases, the superconducting characteristics are lowered. There is no data indicating superconductivity of PrBCO in the first place. However, even in a case where it is assumed that PrBCO is superconducting at the number of oxygen atoms of 6.93, there is a high possibility that PrBCO is non-superconducting at the number of oxygen atoms of 7.4. Alternatively, PrBCO may be a superconductor having a Tc lowered largely.

It is considered how many cells adjacent to a PrBCO unit cell are affected in a case where the number of oxygen atoms changes. It is considered that an excessive amount of oxygen atoms may propagate to the surroundings due to an increase in the number of oxygen atoms. Considering a c-axis oriented structure, if the number of oxygen atoms increases around Pr, there is a high possibility that the excessive amount of oxygen atoms may reach four adjacent cells in an a/b plane because a reaching distance is 0.4 nm. It is difficult to reach YBCO adjacent in a vertical direction because a reaching distance is 1.2 nm. In this case, 5-times degradation in terms of volume is estimated, and a superconducting current in an a-axis direction (or a b-axis direction) is estimated to cause 3-times degradation.

Concerning supply of an oxygen atom from a PrBCO unit cell, it is assumed that 0.20 oxygen atoms are supplied. The number of oxygen atoms in a PrBCO unit cell is 7.23, and therefore PrBCO may be non-superconducting. However, even if all the oxygen atoms are received by adjacent YBCO, the oxygen atoms are dispersed into four, and therefore only 0.05 oxygen atoms per unit cell increases. That is, the number of oxygen atoms is 6.98 in YBCO. This superconductor seems to be a superconductor which has only lowered Tc or Jc. Therefore, it is predicted that not 100% degradation of a cell adjacent to PrBCO but degradation at a magnification smaller than 3 times Pr as a current value in the a-axis direction will occur. This assumption does not match the result in FIG. 11.

Another possibility is becoming non-superconducting due to a stress applied to a unit cell. Even for a sample added with 10% Pr, the c-axis length changes by 1%. In simple estimation, it is considered that the c-axis length may be shortened by 10% in 100% Pr. This is an average deformation amount. If there is a small amount of PrBCO unit cell, a Cu—O plane is largely distorted in the vicinity thereof, and it does not seem that a superconducting current flows.

Deformation of a unit cell due to a change in valence of Pr seems to be caused by an increase in oxygen atoms in the unit cell. If the deformation is transmitted to a first adjacent cell, it is considered that not only four adjacent YBCO unit cells in an a/b plane but also two adjacent YBCO unit cells in a c-axis direction are affected. In other words, 7-times degradation in terms of volume occurs, and 5-times degradation occurs in a case where a superconducting current flows in an a-axis direction.

Becoming non-superconducting as described above may cause degradation of a second adjacent cell. Concerning the deformation amount propagation to an adjacent cell, it is predicted that deformation is propagated at a constant rate or a propagation rate close thereto each time deformation is propagated through a cell from a deformed PrBCO unit cell. The amount may be 10% or 20%. Assuming that the amount of deformation propagation is 20%, 20% of the amount of deformation generated by PrBCO is propagated to the first adjacent cell, and 4% of the deformation amount is propagated to the second adjacent cell.

The deformation amount of PrBCO is about 10% in the first place. Therefore, the deformation amount of the first adjacent cell is 2%, and the deformation amount of the second adjacent cell is 0.4%. Detailed data on the degree of allowable deformation and the deformation amount at which superconducting characteristics are lost is unknown. However, from an experimental result, cells up to the first adjacent cell are highly likely to become non-superconducting.

As described above, it is considered that an artificial pins is formed by deformation, and the artificial pin seems to be maintained even at a low temperature. A researcher studying PrBCO also commented that PrBCO is non-superconducting at least up to several K, and this comment is consistent with the above model.

The artificial pin formed this time is an artificial pin maintaining a perovskite structure. Therefore, in an XRD measurement result, a good YBCO (00n) peak was observed, and there was some change in magnetic field characteristics. In a high resolution cross section TEM, maintenance of a perovskite structure was expected, and a result thereof was as expected. In addition, for example, a Tc value is a crucial characteristic in coil application.

FIG. 9 illustrates a relationship between the addition amount of Pr and a Tc value. FIG. 9 illustrates the added Pr amount on the X axis and a Tc value measured by an induction method on the vertical axis. Concerning measurement by the induction method, a temperature rising rate is as gentle as +0.02° C./min. Therefore, it is difficult to consider that there is a difference other than a temperature difference between a temperature sensor and a sample. It is considered that there is accuracy of about ±0.2 K (accuracy of ±0.9 K according to a manufacturer). FIG. 9 suggests that there is no change up to 8% Pr and that Tc may be slightly lowered at the Pr content of 10%.

From the above model, there is a high possibility that an artificial pin with a volume 7 times the addition amount of Pr and with a cross-sectional area of 5 times when viewed in an a-axis direction is formed. The artificial pin is formed due to lattice distortion, and becomes an artificial pin in a first adjacent cell. However, some distortion remains also in a second adjacent cell. In a state where 10% Pr is added, the volume up to the first adjacent cell reaches 70% in simple calculation without overlap, and the volume up to the second adjacent cell reaches 100%. There is a small distortion in the second adjacent cell. The second adjacent cell should lower Tc to some extent. In this case, it is considered that a Tc value is lowered for the entire wire material.

However, this Tc degradation occurs uniformly. Therefore, unlike Tc degradation in a case where YBCO is cut by adding BZO or the like, there is a possibility that a uniform current is obtained inside even in coil application and the wire material is an applicable Tc-lowering wire material.

FIG. 9 also illustrates a Tc value of a superconductor containing a $BaZrO_3$ artificial pin in a YBCO film formed by a sputtering method. The Tc value is standardized because YBCO originally indicates the same value. In a case of adding BZO, a Tc value is lowered largely even with addition of 5% or 10%. The BZO pin has a size of about 10 nm at minimum. Therefore, there is no 5-times degradation in an a-axis direction, 7-times degradation in volume, or the like unlike PrBCO. An artificial pin formed of 10% BZO is considered to have the content of BZO of approximately 10%.

PrBCO is an artificial pin formed due to lattice deformation, and is estimated to cause 7-times degradation in a volume value. In a case of 8% in FIG. 9, artificial pins are present in an amount of 56% at a volume ratio. It can be understood how easily a Tc value of an artificial pin is maintained in the oxide superconductor according to the present embodiment. It is found that the superconductor presented by the present embodiment has an excellent structure maintaining superconducting characteristics, having a uniform inside, and capable of maintaining a Tc value.

FIG. 10 illustrates Jc-B measurement result for a YBCO film with 0% Pr and a YBCO film mixed with 4% Pr. The YBCO film with 0% Pr indicate s a high Jc value peculiar to a film by the TFA-MOD method. The Jc value reaches 7 $MA/cm^2$. Meanwhile, the YBCO film mixed with 4% Pr has 5-times degradation at zero magnetic field and has characteristics lowered by about 20%.

However, at 0.6 T and 0.9 T, the characteristics of the YBCO film mixed with 4% Pr are reversed and are higher. This is because a Pr unit cell became non-superconducting together with an adjacent first cell and functioned as an artificial pin, and therefore magnetic field characteristics were improved. In the TFA-MOD method, it is difficult to form an artificial pin. However, a superconductor maintaining a Tc was obtained. Note that Tc values of the YBCO film with 0% Pr and the YBCO film mixed with 4% Pr are 90.7 K and 90.7 K, respectively.

In the present embodiment, PrBCO forms a unit cell together with YBCO. This indirectly indicates two important phenomena. One is that Pr is trivalent when forming a perovskite structure. Ce is also a rare earth element. However, Ce cannot form a perovskite structure because Ce is tetravalent, and Ce cannot form a unit cell coexisting with YBCO. It is known that Pr is trivalent to tetravalent. However, it is estimated that Pr is trivalent when forming a perovskite structure.

A principle by which the trivalent Pr becomes a non-superconducting artificial pin is as described above. Pr is trivalent near 800° C. at which Pr forms a perovskite structure. However, it seems that Pr becomes trivalent to tetravalent with a decrease in temperature. Therefore, it seems that a lattice constant, particularly a c-axis length, becomes shorter. It was also observed that the c-axis length became shorter as illustrated in FIG. 4 also in the XRD measurement. The c-axis length was averaged with a parent phase of YBCO, and the lattice constant became slightly shorter.

It is necessary to consider how PrBCO is dispersed in YBCO, and PrBCO is probably ultimately dispersed. Each of PrBCO and YBCO is formed from a pseudo-liquid layer. PrBCO has a large lattice constant at the time of formation. Therefore, due to physical restrictions, a possibility that large PrBCO is formed in an adjacent cell is statistically low, and YBCO is easily formed. Therefore, YBCO is adjacent to PrBCO in many cases.

In a YBCO-based superconductor that forms REBCO, only PrBCO is a non-superconductor. This is considered to be due to a property of becoming trivalent at a high temperature and tetravalent at a low temperature as described above. Therefore, a miracle occurs in which an artificial pin can be formed with an atomic level unit cell using the TFA-MOD method capable of forming a homogeneous superconducting layer as in the present embodiment. Among rare earth elements, only Pr has such a property.

According to the present embodiment, by maintaining a perovskite structure, having a high Tc, having an internal uniform structure, containing a PrBCO unit cell inside, and changing the valence of Pr after firing, PrBCO and a peripheral portion or a part thereof become non-superconducting to realize an oxide superconductor having magnetic field characteristics improved. In addition, Pr-TFA very easily decomposable was necessary to realize the oxide superconductor. However, the solution has been realized by the partially stabilized SIG method (PS-SIG method), and it has become possible to obtain a structure in which atomic level PrBCO is dispersed stably. This PrBCO and REBCO such as YBCO which is a superconducting phase as a parent phase can be adjacent to each other at a unit cell level by making the solution highly pure. Furthermore, unless PrBCO is dispersed inside in an adjacent manner, PrBCO does not function as an artificial pin. It has been confirmed that an oxide superconductor maintains a Tc and improves superconducting characteristics. The oxide superconductor is considered to be a superconductor in which a current is not bypassed inside. Therefore, it is extremely useful for, for example, a superconducting wire material for a coil used in a magnetic field.

Hereinafter, Examples are described.

EXAMPLES

Example 1

First, a coating solution for a PrBCO+YBCO superconductor was synthesized and purified according to the flowchart illustrated in FIG. 5. Powders of hydrates of $Pr(OCOCH_3)_3$, $Y(OCOCH_3)_3$, $Ba(OCOCH_3)_2$, and $Cu(OCOCH_3)_2$ as metal acetates were dissolved in deionized water at a metal ion molar ratio of x:1−x:2:3. Solutions in which values of x were 0.00, 0.03, 0.04, 0.06, 0.08, and 0.10 were prepared.

A solution having x=0.00 was a coating solution for a YBCO superconductor. Each of the resulting solutions was mixed and stirred with a reaction equal molar amount of $CF_3COOH$. The resulting mixed solution was put in an eggplant-shaped flask, and was subjected to a reaction and purification in a rotary evaporator under reduced pressure for 12 hours. Semitransparent blue substances 1Mi-PR00 (substance described in Example 1, material with impurity and Pr 00 atomic %), 1Mi-Pr03, 1Mi-Pr04, 1Mi-Pr06, 1Mi-Pr08, and 1Mi-Pr10 were obtained. The semitransparent blue substances 1Mi-Pr00, 1Mi-Pr03, 1Mi-Pr04, 1Mi-Pr06, 1Mi-Pr08, and 1Mi-Pr10 each contained water or acetic acid as a reaction byproduct at the time of solution synthesis at about 7 wt %.

The obtained semitransparent blue substances 1Mi-Pr00, 1Mi-Pr03, 1Mi-Pr04, 1Mi-Pr06, 1Mi-Pr08, and 1Mi-Pr10 were each completely dissolved in methanol having a weight about 100 times each of the substances (f in FIG. 5), and the solutions were subjected to a reaction and purification again in a rotary evaporator under reduced pressure for 12 hours to obtain semitransparent blue substances 1M-Pr00 (Example 1, material with Pr 00 atomic %), 1Mi-Pr03, 1Mi-Pr04, 1Mi-Pr06, 1Mi-Pr08, and 1Mi-Pr10, respectively. The semitransparent blue substances 1Mi-Pr00, 1Mi-Pr03, 1Mi-Pr04, 1Mi-Pr06, 1Mi-Pr08, and 1Mi-Pr10 were each dissolved in methanol (j in FIG. 5), and were diluted using a measuring flask to obtain 1.50 mol/l coating solutions 1Cs—Y—Pr00 (Example 1, coating solution for Y-based superconductor with Pr 00 atom %), 1Cs—Y—Pr03, 1Cs—Y—Pr04, 1Cs—Y—Pr06, 1Cs—Y—Pr08, and 1Cs—Y—Pr10 in terms of a metal ion, respectively.

Using each of the coating solutions 1Cs—Y—Pr00, 1Cs—Y—Pr03, 1Cs—Y—Pr04, 1Cs—Y—Pr06, 1Cs—Y—Pr08, and 1Cs—Y—Pr10, a film of a superconductor was formed on a $LaAlO_3$ single crystal substrate. For comparison, 1Mi-Pr04 as a substance before purification of 1Cs—Y—Pr04 was adjusted as a coating solution to obtain 1-Csi-Y—Pr04 (substance described in Example 1, coating solution with impurity of Y-based having 4 atom % Pr).

A film was formed at a maximum rotation speed of 4000 rpm using a spin coating method, calcining was performed in a pure oxygen atmosphere at 400° C. or lower in the profile illustrated in FIG. 7, firing was performed in a 1000 ppm oxygen mixed argon gas at 800° C. in the profile illustrated in FIG. 8, and annealing was performed in pure oxygen at 525° C. or lower to obtain superconducting films 1FS—Y—Pr00 (Example 1, film of superconductor, Y-based with Pr 00 atom %), 1FS—Y—Pr03, 1FS—Y—Pr04, 1FS—Y—Pr06, 1FS—Y—Pr08, 1FS—Y—Pr10, and 1FSi—Y—Pr04. For the coating solutions 1Cs—Y—Pr03, 1Cs—Y—Pr06, 1Cs—Y—Pr08, and 1Cs—Y—Pr10, one more sample was further prepared additionally to obtain 1FS—Y—Pr03B, 1FS—Y—Pr06B, 1FS—Y—Pr08B, and 1FS—Y—Pr10B additionally.

FIG. 3 illustrates results of measurement of 1FS—Y—Pr00, 1FS—Y—Pr03, 1FS—Y—Pr06, 1FS—Y—Pr08, and 1FS—Y—Pr10 by a 2θ/ω method of XRD measurement on the Y axis in order from the top.

1FS—Y—Pr10 was obtained by mixing YBCO and PrBCO. It is considered that a peak appear in XRD measurement if 1FS—Y—Pr10 has a structure having a separated inside by performing mixing at 10%. This tendency is observed particularly on a high angle side such as (006) where an angular difference is large. As seen from FIG. 3, the strongest peak at a high angle of a YBCO-based superconductor appears at (006). As seen from the (006) peak, the (006) peak of 1FS—Y—Pr10 is not separated. From this result, it seems that there is a high possibility that 1FS—Y—Pr10 has a single perovskite structure.

In addition to 1FS—Y—Pr10, (006) peaks of 1FS—Y—Pr03, 1FS—Y—Pr06, and 1FS—Y—Pr08 which are superconducting films with an intermediate mixing ratio are not separated. Even when the amount of Pr increases, a single peak is observed. Therefore, it is estimated that a single perovskite structure is included.

FIG. 2 is a cross-sectional observation result of a high-resolution cross section TEM of 1FS—Y—Pr10. It is considered that 1FS—Y—Pr10 has a single lattice structure and a part of a unit cell thereof is PrBCO. It is considered that a structure in which PrBCO does not form an assembly but a YBCO unit cell is adjacent to a PrBCO unit cell is realized.

In an upper part of a film, an oriented structure in almost the same situation as in FIG. 2(b) was continuous, and no heterogeneous phase was observed in the vicinity of a surface. A reason why no heterogeneous phase was observed in the vicinity of a surface is considered to be that the PS-SIG method by which the solution containing Pr was prepared could efficiently remove impurities as in the SIG method which is a method for preparing a coating solution of YBCO alone.

Jc values of 1FS—Y—Pr00, 1FS—Y—Pr03, 1FS—Y—Pr03B, 1FS—Y—Pr06, 1FS—Y—Pr06B, 1FS—Y—Pr08, 1FS—Y—Pr08B, 1FS—Y—Pr10, and 1FS—Y—Pr10B were measured by an induction method under a self-magnetic field in liquid nitrogen. FIG. 11 illustrates a relationship between the amount of Pr entering a site and a Jc value. In the result illustrated in FIG. 11, a Jc is proportional to 5 times the amount of Pr input.

FIG. 10 illustrates a result obtained by performing Jc-B measurement of 1FS—Y—Pr00 and 1FS—Y—Pr04 in liquid nitrogen under conditions of 0 to 0.9 T. 1FS—Y—Pr00 is a standard YBCO film, and indicates a high Jc value peculiar to a film by the TFA-MOD method. The Jc value reaches 7 MA/cm$^2$. Meanwhile, 1FS—Y—Pr04 mixed with 4% Pr has 5-times degradation at zero magnetic field and has characteristics lowered by about 20%.

At 0.6 T and 0.9 T, the characteristics of 1FS—Y—Pr04 are reversed and higher. This is because a Pr unit cell became non-superconducting together with an adjacent first cell and functioned as an artificial pin, and therefore magnetic field characteristics were improved. This indicates that a superconductor maintaining a Tc was obtained by the present invention although it was difficult to form an artificial pin by the TFA-MOD method. Note that is values of 1FS—Y—Pr00 and 1FS—Y—Pr04 were 90.7 K and 90.7 K, respectively.

From the results in Example 1, it is clear that PrBCO and YBCO unit cells have been formed adjacent to each other. In addition, an oxide superconductor in which an atomic level artificial pin is formed and Tc is maintained while Jc-B is improved has been realized.

In a film obtained from 1 Csi-Y—Pr04 prepared by using 1Mi-Pr04 which was a substance before purification as a coating solution, a 5-time degradation phenomenon of the amount of Pr added and a Jc-B improvement effect were not observed. It seems that a Pr component is unevenly distributed in another place without forming a perovskite structure. A reason for this is considered to be that presence of residual water or acetic acid in a coating solution forms PrBCO or $Pr_2O_3$ as a decomposition product starting from water or acetic acid, and a unit cell in which YBCO and PrBCO coexist is not formed. It is considered that the sample formed by mixing YBCO+PrBCO in a bulk body is close to this.

In 1FS—Y—Pr00, 1FS—Y—Pr03, 1FS—Y—Pr03B, 1FS—Y—Pr06, 1FS—Y—Pr06B, 1FS—Y—Pr08, 1FS—Y—Pr08B, 1FS—Y—Pr10, and 1FS—Y—Pr10B which were samples obtained by highly purifying solutions, residual fluorine and residual carbon were analyzed by SIMS measurement. As a result, fluorine at $2.0 \times 10^{16}$ atoms/cc or more and $5.0 \times 10^{19}$ atoms/cc or less and carbon at $1.0 \times 10^{18}$ atoms/cc or more and $5.0 \times 10^{20}$ atoms/cc or less were detected. It seems that the residual fluorine and carbon were formed by a chemical equilibrium reaction peculiar to the TFA-MOD method.

There as a high possibility that effects of the residual fluorine and residual carbon are exhibited in a very high magnetic field. It is known that a Jc value at 5 T is about 1 MA/cm$^2$ and characteristics at 15 T indicate 0.7 to 0.8 MA/cm$^2$ when Jc-B-T measurement of the above samples is performed at 30 K. It is known that the characteristics are hardly lowered despite a large increase in magnetic field strength from 5 T to 15 T. It is considered that this may be an effect of residual fluorine and residual carbon.

Example 2

A coating solution for a PrBCO+YBCO superconductor was synthesized and purified according to the flowchart illustrated in FIG. 5. Powders of hydrates of $Pr(OCOCH_3)_3$, $Y(OCOCH_3)_3$, $Ba(OCOCH_3)_2$, and $Cu(OCOCH_3)_2$ as metal acetates were dissolved in deionized water at a metal ion molar ratio of x:1−x:2:3.

x was 0.12, 0.15, 0.20, 0.25, or 0.30. Each of the resulting solutions was mixed and stirred with a reaction equal molar amount of $CF_3COOH$. The resulting mixed solution was put in an eggplant-shaped flask, and was subjected to a reaction and purification in a rotary evaporator under reduced pressure for 12 hours. In conditions that x was 0.12, 0.15, 0.20, and 0.25, semitransparent blue substances 2Mi-Pr12 (substance described in Example 2, material with impurity and Pr 12 atom %), 2Mi-Pr15, 2Mi-Pr20, and 2Mi-Pr25 were obtained, respectively.

In a condition that x was 0.30, a large amount of opaque light green precipitate was generated. The precipitate was filtered and dried, and then was analyzed. It was found that the precipitate mainly contained $Pr_2O_3$. A sample which generated a precipitate in a solution did not satisfy requirements of the MOD method, and therefore the experiment was stopped here. The semitransparent blue substances 2Mi-Pr12, 2Mi-Pr15, 2Mi-Pr20, and 2Mi-Pr25 each contained water or acetic acid as a reaction byproduct at the time of solution synthesis at about 7 wt %.

The obtained semitransparent blue substances 2Mi-Pr12, 2Mi-Pr15, and 2Mi-Pr20 were each completely dissolved in methanol having a weight about 100 times each of the substances (f in FIG. 5), and the solutions were subjected to a reaction and purification again in a rotary evaporator under reduced pressure for 12 hours to obtain. semitransparent blue substances 2M-Pr12 (Example 2, material with Pr 12 atom %), 2M-Pr15, and 2M-Pr20, respectively. The semitransparent blue substance 2Mi-Pr25 generated a light green precipitate by the above operation and the experiment was stopped.

The semitransparent blue substances 2M-Pr12, 2M-Pr15, and 2M-Pr20 were each dissolved in methanol (j in FIG. 5), and were diluted using a measuring flask to obtain 1.50 mol/l coating solutions 2Cs—Y—Pr12 (Example 2, coating solution for Y-based superconductor with Pr 12 atom %), 2Cs—Y—Pr15, and 2Cs—Y—Pr20, respectively.

Using each of the coating solutions 2Cs—Y—Pr12, 2Cs—Y—Pr15, and 2Cs—Y—Pr20, a film of a superconductor was formed on a $LaAlO_3$ single crystal substrate. A film was formed at a maximum rotation speed of 4000 rpm using a spin coating method, calcining was performed in a pure oxygen atmosphere at 400° C. or lower in the profile illustrated in FIG. 7, firing was performed in a 1000 ppm oxygen mixed argon gas at 800° C. in the profile illustrated in FIG. 8, and annealing was performed in pure oxygen at 525° C. or lower to obtain superconducting films 2FS—Y—Pr12 (Example 2, film of superconductor, Y-based with Pr 12 atom %), 2FS—Y—Pr15, and 2FS—Y—Pr20.

2FS—Y—Pr12, 2FS—Y—Pr15, and 2FS—Y—Pr20 were each measured by a 2θ/5) method of XRD measurement. As a result, a single REBCO (00n) peak was confirmed, and it was found that PrBCO was present as an artificial pin inside in a state where a perovskite structure was maintained.

Jc values (MA/cm$^2$) 2FS—Y—Pr12, 2FS—Y—Pr15, and 2FS—Y—Pr20 were measured by an induction method under a self-magnetic field in liquid nitrogen, and were 3.1, 1.8, and 0.7, respectively. This result indicates that a first adjacent cell of a PrBCO unit cell became non-superconducting, and the Jc values reflected 5-times degradation. When the amount of Pr reached 20%, a Jc value of a superconductor was lowered by about 90%. It was found that the Jc value was largely lowered. However, it was also found that even this amount of Pr provided a structure where PrBCO and YBCO seemed to be adjacent to each other.

2FS—Y—Pr12, 2FS—Y—Pr15, and 2FS—Y—Pr20 were subjected to Jc-B measurement in liquid nitrogen under conditions of 0 to 0.9 T. For comparison with a YBCO standard film, 2FS—Y—Pr12, 2FS—Y—Pr15, and 2FS—Y—Pr20 were compared with the result of 1FS—Y—Pr00 measured in Example 1. An effect of an artificial pin is how much the degree of reduction in Jc value in each sample has been relaxed compared with the degree of reduction in Jc value in 1FS—Y—Pr00 at 0 and 0.9 T. For example, if an effect of 2FS—Y—Pr12 is described as Rp (2FS—Y—Pr12), a calculation formula is as follows.

Rp(2FS—Y—Pr12)={Jc(0.9 T,1FS—Y—Pr00)/Jc(0 T, 1FS—Y—Pr00)}/{Jc(0.9 T,2FS—Y—Pr12)/Jc(0 T,2FS—Y—Pr12)},

Rp represents a ratio of pinning center. In this formula, two numerical values in which 1FS—Y—Pr00 as a YBCO standard sample is involved are fixed values. Jc (0.9 T, 1FS—Y—Pr00)/Jc (0 T, 1FS—Y—Pr00) is 0.0261. Therefore, the above formula can be rewritten as follows.

Rp(2FS—Y—Pr12)=0.0261/{Jc(0.9 T,2FS—Y—Pr12)/Jc (0 T,2FS—Y—Pr12)}

This numerical value indicates how much a YBCO superconducting film was effective with respect to a standard YBCO film by comparing values at 0 T and 0.9 T. For reference, Rp (1FS—Y—Pr04)=1.54 was obtained as a result of FIG. 10.

Similarly, Rp (2FS—Y—Pr12), Rp (2FS—Y—Pr15), and Rp (2FS—Y—Pr20) were calculated to be 1.60, 1.71, and 1.83, respectively. It has been found that any one of these samples is effective as an artificial pin. 2FS—Y—Pr20 containing 20% Pr seems to have somewhat difficulty in reproducibility. However, it has been found that 2FS—Y—Pr20 functions as an artificial pin and improves magnetic field characteristics.

As a result of measuring a Tc value of each sample, 2FS—Y—Pr12, 2FS—Y—Pr15, and 2FS—Y—Pr20 had 90.0 K, 89.7 K, and 89.4 K, respectively It has also been found that Tc tends to lowered when the amount of an artificial pin is large.

Example 3

A coating solution for a PrBCO+YBCO superconductor was synthesized and purified according to the flowchart illustrated in FIG. 5. Powders of hydrates of Pr(OCOCH$_3$)$_3$, Y(OCOCH$_3$)$_3$, Ba(OCOCH$_3$)$_2$, and Cu(OCOCH$_3$)$_2$ as metal acetates were dissolved in deionized water at a metal ion molar ratio of x:1−x:2:3.

x was 0.001, 0.002, 0.003, 0.005, 0.01, or 0.02. Each of the resulting solutions was mixed and stirred with a reaction equal molar amount of CF$_3$COOH. The resulting mixed solution was put in an eggplant-shaped flask, and was subjected to a reaction and purification in a rotary evaporator under reduced pressure for 12 hours. Semitransparent blue substances 3Mi-Pr0.1 (substance described in Example 3, material with impurity and Pr 0.1 atomic %), 3Mi-Pr0.2, 3Mi-Pr0.3, 3Mi-Pr0.5, 3Mi-Pr1, and 3Mi-Pr2 were obtained.

The semitransparent blue substances 3Mi-Pr0.1, 3Mi-Pr0.2, 3Mi-Pr0.3, 3Mi-Pr0.5, 3Mi-Pr1, and 3Mi-Pr2 each contained water or acetic acid as a reaction byproduct at the time of solution synthesis at about 7 wt %.

The obtained semitransparent blue substances 3Mi-Pr0.1, 3Mi-Pr0.2, 3Mi-Pr0.3, 3Mi-Pr0.5, 3Mi-Pr1, and 3Mi-Pr2 were each completely dissolved in methanol having a weight about 100 times each of the substances (f in FIG. 5), and the solutions were subjected to a reaction and purification again in a rotary evaporator under reduced pressure for 12 hours to obtain semitransparent blue substances 3M-Pr0.1 (Example 3, material with Pr 0.1 atomic %), 3M-Pr0.2, 3M-Pr0.3, 3M-Pr0.5, 3M-Pr1, and 3M-Pr2, respectively.

The semitransparent blue substances 3M-Pr0.1, 3M-Pr0.2, 3M-Pr0.3, 3M-Pr0.5, 3M-Pr1, and 3M-Pr2 were each dissolved in methanol (j in FIG. 5), and were diluted using a measuring flask to obtain 1.50 mol/l coating solutions 3Cs—Y—Pr0.1 (Example 3, coating solution for Y-based superconductor with Pr 0.1 atomic), 3Cs—Y—Pr0.2, 3Cs—Y—Pr0.3, 3Cs—Y—Pr0.5, 3Cs—Y—Pr1, and 3Cs—Y—Pr2 in terms of a metal ion, respectively.

Using each of the coating solutions 3Cs—Y—Pr0.1, 3Cs—Y—Pr0.2, 3Cs—Y—Pr0.3, 3Cs—Y—Pr0.5, 3Cs—Y—Pr1, and 3Cs—Y—Pr2, a film of a superconductor was formed on a LaAlO$_3$ single crystal substrate. A film was formed at a maximum rotation speed of 4000 rpm using a spin coating method, calcining was performed in a pure oxygen atmosphere at 400° C. or lower in the profile illustrated in FIG. 7, firing was performed in a 1000 ppm oxygen mixed argon gas at 800° C. in the profile illustrated in FIG. 8, and annealing was performed in pure oxygen at 525° C. or lower to obtain superconducting films 3FS—Y—Pr0.1 (Example 3, film of superconductor, Y-based with Pr 0.1 atomic %), 3FS—Y—Pr0.2, 3FS—Y—Pr0.3, 3FS—Y—Pr0.5, 3FS—Y—Pr1, and 3FS—Y—Pr2.

3FS—Y—Pr0.1, 3FS—Y—Pr0.2, 3FS—Y—Pr0.3, 3FS—Y—Pr0.5, 3FS—Y—Pr1, and 3FS—Y—Pr2 were each measured by a 2θ/ω method of XRD measurement, and a single REBCO (00n) peak was confirmed. In these samples, the amount of PrBCO is small, and therefore there is a high possibility that PrBCO does not appear in peak intensity even if segregation is performed. However, considering that lattice disorder is small and a PrBCO unit cell can be formed up to 20% at maximum, it seems that there is a high possibility that PrBCO is present inside as an artificial pin while a perovskite structure is maintained.

Jc values (MA/cm$^2$) of 3FS—Y—Pr0.1, 3FS—Y—Pr0.2, 3FS—Y—Pr0.3, 3FS—Y—Pr0.5, 3FS—Y—Pr1, and 3FS—Y—Pr2 were measured by an induction method under a self-magnetic field in liquid nitrogen, and were 7.6, 7.7, 7.4, 7.4, 7.2, and 6.9, respectively. This result indicates that a first adjacent cell of a PrBCO unit cell became non-superconducting, and the Jc values reflected 5-times degradation. However, in a case where the amount of Pr is 0.1 or 0.2, the change is a minute amount and it seems that it is difficult to judge whether an effect of 5-times degradation is obtained.

3FS—Y—Pr0.1, 3FS—Y—Pr0.2, 3FS—Y—Pr0.3, 3FS—Y—Pr0.5, 3FS—Y—Pr1, and 3FS—Y—Pr2 were subjected to Jc-B measurement in liquid nitrogen under conditions of 0 to 0.9 T. For comparison with a YBCO standard film, 3FS—Y—Pr0.1, 3FS—Y—Pr0.2, 3FS—Y—Pr0.3, 3FS—Y—Pr0.5, 3FS—Y—Pr1, and 3FS—Y—Pr2 were compared with the result of 1FS—Y—Pr00 measured in Example 1. Using the calculation formula in Example 2, Rp is calculated. A calculation formula of Rp is as follows.

Rp(2FS—Y—Pr0.1)=0.0261/{Jc(0.9 T,2FS—Y—Pr0.1)/Jc(0 T, 2FS—Y—Pr0.1)}

(3FS—Y—Pr0.1), Rp (3FS—Y—Pr0.2), Rp (3FS—Y—Pr0.3), Rp (3FS—Y—Pr0.5), Rp (3FS—Y—Pr1), and Rp (3FS—Y—Pr2) of the obtained films were 1.12, 1.07, 1.49, 1.52, 1.55, and 1.47, respectively. The Rp values of 3FS—Y—Pr0.3, 3FS—Y—Pr0.5, 3FS—Y—Pr1, and 3FS—Y—Pr2 are considered to be due to an effect of an artificial pin. It has been found that there is a certain effect in a case of Pr≥0.003.

As a result of measuring Tc values of the samples, Tc values of 3FS—Y—Pr0.1, 3FS—Y—Pr0.2, 3FS—Y—Pr0.3, 3FS—Y—Pr0.5, 3FS—Y—Pr1, and 3FS—Y—Pr2 were 90.7 K, 90.6 K, 90.7 K, 90.7 K, 90.7 K, and 90.8 K, respectively. It has been found that Tc is constant with this amount of artificial pins.

In a case where Pr occupied in a in site is 2% or less, it is estimated that all the atoms of Pr enter the site and serve as artificial pins in view of the discussion so far. However, it has been found that it is difficult to confirm an improvement effect probably because the amount of artificial pins is too small in a case where the amount of Pr is 0.1% or 0.2%. However, in a case of 0.3% or more, it has been found that there is a certain effect or more and that magnetic field characteristics are improved.

Example 4

A coating solution for a PrBCO+GdBCO superconductor was synthesized and purified according to the flowchart illustrated in FIG. 5. Powders of hydrates of $Pr(OCOCH_3)_3$, $Gd(OCOCH_3)_3$, $Ba(OCOCH_3)_2$, and $Cu(OCOCH_3)_2$ as metal acetates were dissolved in deionized water at a metal ion molar ratio of 0.04:0.96:2:3. The resulting solution was mixed and stirred with a reaction equal molar amount of $CF_3COOH$. The resulting mixed solution was put in an eggplant-shaped flask, and was subjected to a reaction and purification in a rotary evaporator under reduced pressure for 12 hours. A semitransparent blue substance 4Mi-GdPr04 (substance described in Example 4, Gd-based material having Pr 4 atomic % with impurity) was obtained.

Using $Tb(OCOCH_3)_3$, $Dy(OCOCH_3)_3$, $Ho(OCOCH_3)_3$, $Er(OCOCH_3)_3$, $Tm(OCOCH_3)_3$, $Yb(OCOCH_3)_3$, and $Lu(OCOCH_3)_3$ in place of the above $Gd(OCOCH_3)_3$, semitransparent blue (partly different from blue color) substances 4Mi-TbPr04, 4Mi-DyPr04, 4Mi-HoPr04, 4Mi-ErPr04, 4Mi-TmPr04, 4Mi-YbPr04, and 4Mi-LuPr04 were similarly obtained, respectively.

In addition to the above solutions, a solution containing no Pr was prepared. Powders of hydrates of $Gd(OCOCH_3)_3$, $Ba(OCOCH_3)_2$, and $Cu(OCOCH_3)_2$ as metal acetates were dissolved in deionized water at a metal ion molar ratio of 1:2:3. The resulting solution was mixed and stirred with a reaction equal molar amount of $CF_3COOH$. The resulting mixed solution was put in an eggplant-shaped flask, and was subjected to a reaction and purification in a rotary evaporator under reduced pressure for 12 hours to obtain a semitransparent blue substance 4Mi-GdPr00 (substance described in Example 4, Gd-based material having Pr 00 atomic % with impurity).

Using $Tb(OCOCH_3)_3$, $Dy(OCOCH_3)_3$, $Ho(OCOCH_3)_3$, $Er(OCOCH_3)_3$, $Tm(OCOCH_3)_3$, $Yb(OCOCH_3)_3$, and $Lu(OCOCH_3)_3$ in place of the above $Gd(OCOCH_3)_3$, semitransparent blue (partly different from blue color) substances 4Mi-TbPr00, 4Mi-DyPr00, 4Mi-HoPr00, 4Mi-ErPr00, 4Mi-TmPr00, 4Mi-YbPr00, and 4Mi-LuPr00 were similarly obtained, respectively.

The semitransparent blue substances 4Mi-GdPr04, 4Mi-TbPr04, 4Mi-DyPr04, 4Mi-HoPr04, 4Mi-ErPr04, 4Mi-TmPr04, 4Mi-YbPr04, 4Mi-LuPr04 and 4Mi-GdPr00, 4Mi-TbPr00, 4Mi-DyPr00, 4Mi-HoPr00, 4Mi-ErPr00, 4Mi-TmPr00, 4Mi-YbPr00, and 4Mi-LuPr00 each contained water or acetic acid as a reaction byproduct at the time of solution synthesis at about 7 wt %.

The obtained semitransparent blue substances 4Mi-GdPr04, 4Mi-TbPr04, 4Mi-DyPr04, 4Mi-HoPr04, 4Mi-ErPr04, 4Mi-TmPr04, 4Mi-YbPr04, 4Mi-LuPr04, 4Mi-GdPr00, 4Mi-TbPr00, 4Mi-DyPr00, 4Mi-HoPr00, 4Mi-ErPr00, 4Mi-TmPr00, 4Mi-YbPr00, and 4Mi-LuPr00 were each completely dissolved in methanol having a weight about 100 times each of the substances (f in FIG. 5), and the solutions were subjected to a reaction and purification again in a rotary evaporator under reduced pressure for 12 hours to obtain semitransparent blue substances 4M-GdPr04 (Example 4, Gd-based material having Pr 4 atomic %), 4M-TbPr04, 4M-DyPr04, 4M-HoPr04, 4M-ErPr04, 4M-TmPr04, 4M-YbPr04, 4M-LuPr04, 4M-GdPr00, 4M-TbPr00, 4M-DyPr00, 4M-HoPr00, 4M-ErPr00, 4M-TmPr00, 4M-YbPr00, and 4M-LuPr00, respectively.

The semitransparent blue substances 4M-GdPr04, 4M-TbPr04, 4M-DyPr04, 4M-HoPr04, 4M-ErPr04, 4M-TmPr04, 4M-YbPr04, 4M-LuPr04, 4M-GdPr00, 4M-TbPr00, 4M-DyPr00, 4M-HoPr00, 4M-FrPr00, 4M-TmPr00, 4M-YbPr00, and 4M-LuPr00 were each dissolved in methanol (j in FIG. 5), and were diluted using a measuring flask to obtain 1.50 mol/l coating solutions 4Cs—GdPr04 (Example 4, coating solution for Y-based superconductor with Pr 04 atomic %), 4Cs—TbPr04, 4Cs—DyPr04, 4Cs—HoPr04, 4Cs—ErPr04, 4Cs—TmPr04, 4Cs—YbPr04, 4Cs—LuPr04, 4Cs—GdPr00, 4Cs—TbPr00, 4Cs—DyPr00, 4Cs—HoPr00, 4Cs—ErPr00, 4Cs—TmPr00, 4Cs—YbPr00, and 4Cs—LuPr00, respectively.

Using each of the coating solutions 4Cs—GdPr04, 4Cs—TbPr04, 4Cs—DyPr04, 4Cs—HoPr04, 4Cs—ErPr04, 4Cs—TmPr04, 4Cs—YbPr04, 4Cs—LuPr04, 4Cs—GdPr00, 4Cs—TbPr00, 4Cs—DyPr00, 4Cs—HoPr00, 4Cs—ErPr00, 4Cs—TmPr00, 4Cs—YbPr00, and 4Cs—LuPr00, a film of a superconductor was formed on a $LaAlO_3$ single crystal substrate. A film was formed at a maximum rotation speed of 4000 rpm using a spin coating method, calcining was performed in a pure oxygen atmosphere at 400° C. or lower in the profile illustrated in FIG. 7, firing was performed in a 200 to 4000 ppm oxygen mixed argon gas at 800° C. in the profile illustrated in FIG. 8, and annealing was performed in pure oxygen at 525° C. or lower to obtain superconducting films 4FS—GdPr04 (Example 4, film of superconductor, Gd-based with Pr 04 atomic %), 4FS—TbPr04, 4FS—DyPr04, 4FS—HoPr04, 4FS—ErPr04, 4FS—TmPr04, 4FS—YbPr04, 4FS—LuPr04, 4FS—GdPr00, 4FS—TbPr00, 4FS—DyPr00, 4FS—HoPr00, 4FS—ErPr00, 4FS—TmPr00, 4FS—YbPr00, and 4FS—LuPr00.

An oxygen partial pressure during firing follows an element in a parent phase. For example, firing is performed at 200 ppm for Gd and at 1000 ppm for Dy. An optimum oxygen partial pressure for each element is used, and it is not necessary here to consider the content of Pr added. There is a high possibility that the optimum oxygen partial pressure is a logarithmic intermediate value. However, the content of Pr is only 4% here, and therefore a superconductor was obtained without considering the content of Pr.

4FS—GdPr04, 4FS—TbPr04, 4FS—DyPr04, 4FS—HoPr04, 4FS—ErPr04, 4FS—TmPr04, 4FS—YbPr04, 4FS—LuPr04 and 4FS—GdPr00, 4FS—TbPr00, 4FS—DyPr00, 4FS—HoPr00, 4FS—ErPr00, 4FS—TmPr00, 4FS—YbPr00, and 4FS—LuPr00 were each measured by a 2θ/ω method of XRD measurement, and a single REBCO (00n) peak was confirmed. In superconductors having the same parent phase, for example, in 4FS—GdPr04 and 4FS—GdPr00, there was no difference in the REBCO (00n) peak position, and it was found that PrBCO was present inside as an artificial pin while a perovskite structure was maintained.

Jc values (MA/cm$^2$) of 4FS—GdPr04, 4FS—TbPr04, 4FS—DyPr04, 4FS—HoPr04, 4FS—ErPr04, 4FS—TmPr04, 4FS—YbPr04, and 4FS—LuPr04 were measured by an induction method under a self-magnetic field in liquid nitrogen, and were 5.5, 5.3, 5.7, 5.4, 4.9, 5.6, 5.2, and 5.1, respectively.

Tc values (K) of 4FS—GdPr04, 4FS—TbPr04, 4FS—DyPr04, 4FS—HoPr04, 4FS—ErPr04, 4FS—TmPr04, 4FS—YbPr04, and 4FS—LuPr04 measured by the induction method were 91.8 K, 91.4 K, 90.0 K, 90.8 K, 90.6 K, 90.3 K, 89.8 K, and 89.4 K, respectively.

Jc values (MA/cm$^2$) of 4FS—GdPr00, 4FS—TbPr00, 4FS—DyPr00, 4FS—HoPr00, 4FS—ErPr00, 4FS—TmPr00, 4FS—YbPr00, and 4FS—LuPr00 were measured by an induction method under a self-magnetic field in liquid nitrogen, and were 6.7, 6.5, 7.1, 6.9, 6.3, 7.3, 6.9, and 6.6, respectively. For example, with respect to 4FS—GdPr00 as a superconductor containing Pr, a Jc value of 4FS—GdPr04 as a superconductor containing Pr was lowered by around 20% characteristics. It seem that a characteristic lowering phenomenon occurred because a first adjacent cell of Pr became non-superconducting. That is, it is found that an artificial pin is formed while a perovskite structure is formed.

Tc values (K) of 4FS—GdPr00, 4FS—TbPr00, 4FS—DyPr00, 4FS—HoPr00, 4FS—ErPr00, 4FS—TmPr00, 4FS—YbPr00, and 4FS—LuPr00 measured by an induction method were 91.9 K, 91.5 K, 90.2 K, 90.7 K, 90.5 K, 90.3 K, 89.9 K, and 89.5 K, respectively. It seemed that there was almost no effect of adding Pr.

4FS—GdPr04, 4FS—TbPr04, 4FS—DyPr04, 4FS—HoPr04, 4FS—ErPr04, 4FS—TmPr04, 4FS—TmPr04, 4FS—LuPr04, 4FS—GdPr00, 4FS—TbPr00, 4FS—DyPr00, 4FS—HoPr00, 4FS—ErPr00, 4FS—TmPr00, 4FS—YbPr00, and 4FS—LuPr00 were subjected to Jc-B measurement in liquid nitrogen under conditions of 0 to 0.9 T.

In order to evaluate a characteristic improvement effect of each element by artificial pins, a Rp value was calculated. A calculation formulas or the like is as described in Example 2.

The obtained Rp (4FS—GdPr04), Rp (4FS—TbPr04), Rp (4FS—DyPr04), Rp (4FS—HoPr04), Rp (4FS—ErPr04), Rp (4FS—TmPr04), Rp (4FS—YbPr04), and Rp (4FS—LuPr04) were 1.52, 1.57, 1.61, 1.63, 1.59, 1.60, 1.47, and 1.45, respectively. A magnetic field characteristic improvement effect caused by ultimate dispersion of PrBCO could be confirmed.

In the description up to Example 2, in a case where a parent phase was YBCO, PrBCO formed an artificial pin and exhibited a magnetic field characteristic improvement effect. However, it has been found that the magnetic field characteristic Improvement effect is obtained even in a case where the parent phase is changed from YBCO to a substance which can be formed of a TFA salt such as GdBCO. This is considered to be because YBCO and the REBCO have perovskite structures with almost the same lattice constant and formation of a PrBCO artificial pin in a perovskite structure depends on a lattice constant.

Example 5

According to the flow chart illustrated in FIG. 5, a coating solution for a PrBCO+DyBCO superconductor was synthesized and purified, and a coating solution for a PrBCO+TmBCO superconductor was synthesized and purified. These two solutions were mixed, and it was thereby tried to form a superconductor in which a parent phase contained Dy and Tm at an arbitrary ratio.

According to the flow chart illustrated in FIG. 5, powders of hydrates of Pr(OCOCH$_3$)$_3$, Dy(OCOCH$_3$)$_3$, Ba(OCOCH$_3$)$_2$, and Cu(OCOCH$_3$)$_2$ as metal acetates were dissolved in deionized water at a metal ion molar ratio of 0.04:0.96:2:3. The resulting solution was mixed and stirred with a reaction equal molar amount of CF$_3$COOH. The resulting mixed solution was put in an eggplant-shaped flask, and was subjected to a reaction and purification in a rotary evaporator under reduced pressure for 12 hours to obtain a semitransparent blue substance 5Mi-DyPr04 (substance described in Example 5, Dy-based material having Pr 4 atomic % with impurity).

Powders of hydrates of Pr(OCOCH$_3$)$_3$, Tm(OCOCH$_3$)$_3$, Ba(OCOCH$_3$)$_2$, and Cu(OCOCH$_3$)$_2$ as metal acetates were similarly dissolved in deionzied water at a metal ion molar ratio of 0.04:0.96:2:3. The resulting solution was mixed and stirred with a reaction equal molar amount of CF$_3$COOH. The resulting mixed solution was put in an eggplant-shaped flask, and was subjected to a reaction and purification in a rotary evaporator under reduced pressure for 12 hours to obtain a semitransparent blue substance 5Mi-TmPr04 (substance described in Example 5, Tm-based material having Pr 4 atomic % with impurity).

The semitransparent blue substances 5Mi-DyPr04 and 5Mi-TmPr04 each contained water or acetic acid as a reaction byproduct at the time of solution synthesis at about 7 wt %.

The obtained semitransparent blue substances 5Mi-DyPr04 and 5Mi-TmPr04 were each completely dissolved in methanol having a weight about 100 times the substance (f in FIG. 5), and the solutions were subjected to a reaction and purification again in a rotary evaporator under reduced pressure for 12 hours to obtain semitransparent blue substances 5M-DyPr04 (substance described in Example 5, Dy-based material Pr 4 atomic %) and 5M-TmPr04, respectively.

The semitransparent blue substances 5M-DyPr04 and 5M-TmPr04 were each dissolved in methanol (j in FIG. 5), and were diluted using a measuring flask to obtain 1.50 mol/l coating solutions 5Cs—DyPr04 (Example 5, coating solution for Dy-based superconductor with Pr 04 atomic %) and 5Cs—TmPr04, respectively.

The coating solutions 5Cs—DyPr04 and 5Cs—TmPr04 were mixed at 10:90, 25:75, 50:50, 75:25, and 90:10 to obtain coating solutions 5Cs—Dy10Tm90+Pr04 (Example 5, coating solution having 10% DyBCO and 90% TmBCO with additional 4% PrBCO), 5Cs—Dy25Tm75+Pr04, 5Cs—Dy50Tm50+Pr04, 5Cs—Dy75Tm25+Pr04, and 5Cs—Dy90Tm10+Pr04, respectively.

Using each of the coating solutions 5Cs—Dy10Tm90+Pr04, 5Cs—Dy25Tm75+Pr04, 5Cs—Dy50Tm50+Pr04, 5Cs—Dy75Tm25+Pr04, and 5Cs—Dy90Tm10+Pr04, a film of a superconductor was formed on a $LaAlO_3$ single crystal substrate. A film was formed at a maximum rotation speed of 4000 rpm using a spin coating method, calcining was performed in a pure oxygen atmosphere at 400° C. or lower in the profile illustrated in FIG. 7, firing was performed in a 1000 ppm oxygen mixed argon gas at 800° C. in the profile illustrated in FIG. 8, and annealing was performed in pure oxygen at 525° C. or lower to obtain superconducting films 5FS—Dy10Tm90+Pr04 (Example 5, film of superconductor, 10% DyBCO and 90% TmBCO mixed with additional Pr 04 atomic %), 5FS—Dy25Tm75+Pr04, 5FS—Dy50Tm50+Pr04, 5FS—Dy75Tm25+Pr04, and 5FS—Dy90Tm10+Pr04.

The superconducting film 5FS—Dy10Tm90+Pr04, 5FS—Dy25Tm75+Pr04, 5FS—Dy50Tm50+Pr04, 5FS—Dy75Tm25+Pr04, and 5FS—Dy90Tm10+Pr04 were each measured by a 2θ/ω method of XRD measurement, and a single REBCO (00n) peak was confirmed. It has been reported that a single perovskite structure is formed even by mixing DyBCO and TmBCO at an arbitrary ratio. However, it has been found that a similar single perovskite structure is formed even by adding a raw material of PrBCO to a highly purified solution.

Jc values ($MA/cm^2$) of 5FS—Dy10Tm90+Pr04, 5FS—Dy25Tm75+Pr04, 5FS—Dy50Tm50+Pr04, 5FS—Dy75Tm25+Pr04, and 5FS—Dy90Tm10+Pr04 were measured by an induction method under a self-magnetic field in liquid nitrogen, and were 5.2, 5.3, 5.6, 5.4, and 5.0, respectively. It is estimated that a result that characteristics were lowered by about 20% with respect to a sample containing no Pr was obtained due to addition of 4% PrBCO and a 5-times degradation phenomenon.

Tc values (K) of 5FS—Dy10Tm90+Pr04, 5FS—Dy25Tm7+Pr04, 5FS—Dy50Tm50+Pr04, 5FS—Dy75Tm25+Pr04, and 5FS—Dy90Tm10+Pr04 by an induction method were 90.7 K, 90.5 K, 90.6 K, 90.8 K, and 90.5 K, respectively. It has been indicated again that these superconducting films do not lower a Tc.

5FS—Dy10Tm90+Pr04, 5FS—Dy25Tm75+Pr04, 5FS—Dy50Tm50+Pr04, 5FS—Dy75Tm25+Pr04, and 5FS—Dy90Tm10+Pr04 were subjected to Jc-B measurement in liquid nitrogen under conditions of 0 and 0.9 T.

In order to evaluate a characteristic improvement effect of each element by artificial pins, Rp was calculated. A solution mixed with Dy and Tm corresponding to a measurement sample and containing no Pr was not formed. However, from the result in Example 3, it is found that characteristics are stable. Therefore, a numerical value in Example 3 in which Pr was added to Tm was substituted.

The obtained Rp (5FS—Dy10Tm90+Pr04), Rp (5FS—Dy25Tm75+Pr04), Rp (5FS—Dy50Tm50+Pr04), Rp (5FS—Dy75Tm25+Pr04), and Rp (5FS—Dy90Tm10+Pr04) were 1.50, 1.52, 1.63, 1.57, and 1.54, respectively. Even in a parent phase in which Dy and Tm were mixed, a magnetic field characteristic improvement effect caused by ultimate dispersion of PrBCO could be confirmed.

Even if a parent phase is not a single composition, a lattice constant does not change as much if a substance that comes to a Y site is RE even in a mixed state of two or more kinds. It seems that this is because formation of an artificial pin depends on a physical size.

Example 6

According to the flow chart illustrated in FIG. 5, a coating solution for a PrBCO+DyBCO superconductor was synthesized and purified, and a coating solution for a PrBCO+HoBCO superconductor was synthesized and purified. These two solutions were mixed, and it was thereby tried to form a superconductor in which a parent phase contained Dy and Ho at an arbitrary ratio.

According to the flow chart illustrated in FIG. 5, powders of hydrates of $Pr(OCOCH_3)_3$, $Dy(OCOCH_3)_3$, $Ba(OCOCH_3)_2$, and $Cu(OCOCH_3)_2$ as metal acetates were dissolved in deionized water at a metal ion molar ratio of 0.04:0.96:2:3. The resulting solution was mixed and stirred with a reaction equal molar amount of $CF_3COOH$. The resulting mixed solution was put in an eggplant-shaped flask, and was subjected to a reaction and purification in a rotary evaporator under reduced pressure for 12 hours to obtain a semitransparent blue substance 6Mi-DyPr04 (substance described in Example 6, Dy-based material having Pr 4 atomic % with impurity).

Powders of hydrates of $Pr(OCOCH_3)_3$, $Ho(OCOCH_3)_3$, $Ba(OCOCH_3)_2$, and $Cu(OCOCH_3)_2$ as metal acetates were similarly dissolved in deionized water at a metal ion molar ratio of 0.04:0.96:2:3. The resulting solution was mixed and stirred with a reaction equal molar amount of $CF_3COOH$. The resulting mixed solution was put in an eggplant-shaped flask, and was subjected to a reaction and purification in a rotary evaporator under reduced pressure for 12 hours to obtain a semitransparent blue substance 6Mi-HoPr04 (substance described in Example 6, Ho-based material having Pr 4 atomic % with impurity).

The semitransparent blue substances 6Mi-DyPr04 and 6Mi-HoPr04 each contained water or acetic acid as a reaction byproduct at the time of solution synthesis at about 7 wt %.

The obtained semitransparent blue substances 6Mi-DyPr04 and 6Mi-HoPr04 were each completely dissolved in methanol having a weight about 100 times the substance (f in FIG. 5), and the solutions were subjected to a reaction and purification again in a rotary evaporator under reduced pressure for 12 hours to obtain semitransparent blue substances 6M-DyPr04 (Example 6, Dy-based material having Pr 4 atomic %) and 6M-HoPr04, respectively.

The semitransparent blue substances 6M-DyPr04 and 6M-HoPr04 were each dissolved in methanol (Cs-j in FIG. 1), and were diluted using a measuring flask to obtain 1.50 mol/l coating solutions 6Cs—DyPr04 (Example 6, coating solution for Dy-based superconductor with Pr 04 atomic %) and 6Cs—HoPr04, respectively.

The coating solutions 6Cs—DyPr04 and 6Cs—HoPr04 were mixed at 10:90, 25:75, 50:50, 75:25, and 90:10 to obtain coating solutions 6Cs—Dy10Ho90+Pr04 (Example 6, coating solution having 10% DyBCO and 90% HoBCO with additional 4% PrBCO), 6Cs—Dy25Ho75+Pr04, 6Cs—Dy50Ho50+Pr04, 6Cs—Dy75Ho25+Pr04, and 6Cs—Dy90Ho10+Pr04, respectively.

Using each of the coating solutions 6Cs—Dy10Ho90+Pr04, 6Cs—Dy25Ho75+Pr04, 6Cs—Dy50Ho50+Pr04, 6-Cs—Dy75Ho25+Pr04, and 6Cs—Dy90Ho10+Pr04, a film of a superconductor was formed on a LaAlO$_3$ single crystal substrate. A film was formed at a maximum rotation speed of 4000 rpm using a spin coating method, calcining was performed in a pure oxygen atmosphere at 400° C. or lower in the profile illustrated in FIG. 7, firing was performed in a 1000 ppm oxygen mixed argon gas at 800° C. in the profile illustrated in FIG. 8, and annealing was performed in pure oxygen at 525° C. or lower to obtain superconducting films 6FS—Dy10Ho90+Pr04 (Example 6, film of superconductor, 10% DyBCO and 90% HoBCO mixed with additional Pr 04 atomic %), 6FS—Dy25Ho75+Pr04, 6FS—Dy50Ho50+Pr04, 6FS—Dy75Ho25+Pr04, and 6FS—Dy90Ho10+Pr04.

The superconducting film GFS—Dy10Ho90+Pr04, 6FS—Dy25Ho75+Pr04, 6FS—Dy50Ho50+Pr04, 6FS—Dy75Ho25+Pr04, and 6FS—Dy90Ho10+Pr04 were each measured by a 2θ/ω method of XRD measurement, and a single REBCO (00n) peak was confirmed. It has been reported that a single perovskite structure is formed even by mixing DyBCO and HoBCO at an arbitrary ratio. However, it has been found that a similar single perovskite structure is formed even by adding a raw material of PrBCO to a highly purified solution. From a combination with Example 4, it seems that similar mixing can be performed for all the elements that can be constituted as a parent phase.

Jc values (MA/cm$^2$) of 6FS—Dy10Ho90+Pr04, 6FS—Dy25Ho75+Pr04, 6FS—Dy50Ho50+Pr04, 6FS—Dy75Ho25+Pr04, and 6FS—Dy90Ho10+Pr04 were measured by an induction method under a self-magnetic field in liquid nitrogen, and were 5.0, 5.0, 5.3, 5.2, and 4.7, respectively. It is estimated that a result that characteristics were lowered by about 20% with respect to a sample containing no Pr was obtained due to addition of 4% PrBCO and a 5-times degradation phenomenon.

6FS—Dy10Ho90+Pr04, 6FS—Dy25Ho75+Pr04, 6FS—Dy50Ho50+Pr04, 6FS—Dy75Ho25+Pr04, and 6FS—Dy90Ho10+Pr04 were subjected to Jc-B measurement in liquid nitrogen under conditions of 0 T and 0.9 T.

In order to evaluate a characteristic improvement effect of each element by artificial pins, evaluation was performed using Rp calculated in Example 2. The obtained Rp (6FS—Dy10Ho90+Pr04), Rp (6FS—Dy25Ho75+Pr04), Rp (6FS—Dy50Ho50+Pr04), Rp (6FS—Dy75Ho25+Pr04), and Rp (6FS—Dy90Ho10+Pr04) were 1.51, 1.51, 1.58, 1.52, and 1.48, respectively. Even in a parent phase in which Dy and Ho were mixed, a magnetic field characteristic improvement effect caused by ultimate dispersion of PrBCO could be confirmed.

A Tc value of each sample was measured by an induction method. Tc (6FS—Dy10Ho90+Pr04), Tc (6FS—Dy25Ho75+Pr04), Tc (6FS—Dy50Ho50+Pr04), Tc (6FS—Dy75Ho25+Pr04), and Tc (6FS—Dy90Ho10+Pr04) were 90.5 K, 90.6 K, 90.7 K, 90.9 K, and 91.0 K, respectively. It has been found that Tc does not almost change even if a parent phase changes.

Even if a parent phase is an element in a mixed state of two or more kinds, a lattice constant does not change largely as long as a substance that comes to a Y site is RE. It seems that this is because formation of an artificial pin depends on a physical size. It has been found that a similar effect can be obtained even by mixing parent phase elements each formed of a single element to obtain a parent phase formed of two or more kinds of elements.

Example 7

According to the flow chart illustrated in FIG. 5, a coating solution for a PrBCO+NdBCO+YBCO superconductor was synthesized and purified, a coating solution for a PrBCO+SmBCO+YBCO superconductor was synthesized and purified, and it was tried to form a superconductor. Whether a superconductors could be formed and whether PrBCO functioned as an artificial pin were examined.

According to the flow chart illustrated in FIG. 5, powders of hydrates of Pr(OCOCH$_3$)$_3$, Nd(OCOCH$_3$)$_3$, Y(OCOCH$_3$)$_3$Ba(OCOCH$_3$)$_2$, and Cu(OCOCH$_3$)$_2$ as metal acetates were dissolved in deionized water at a metal ion molar ratio of 0.04:0.04:0.92:2:3. The resulting solution was mixed and stirred with a reaction equal molar amount of CF$_3$COOH. The resulting mixed solution was put in an eggplant-shaped flask, and was subjected to a reaction and purification in a rotary evaporator under reduced pressure for 12 hours to obtain a semitransparent blue substance 7Mi-YPr04Nd04 (substance described in Example 7, Y-based material having Pr 4 atomic % and Nd 4 atomic % with impurity).

Powders of hydrates of Pr(OCOCH$_3$)$_3$, Sm(OCOCH$_3$)$_3$, Y(OCOCH$_3$)$_3$, Ba(OCOCH$_3$)$_2$, and Cu(OCOCH$_3$)$_2$, as metal acetates were similarly dissolved in deionized water at a metal ion molar ratio of 0.04:0.04:0.92:2:3. The resulting solution was mixed and stirred with a reaction equal molar amount of CF$_3$COOH. The resulting mixed solution was put in an eggplant-shaped flask, and was subjected to a reaction and purification in a rotary evaporator under reduced pressure for 12 hours to obtain a semitransparent blue substance 7Mi-YPr04Sm04 (substance described in Example 7, Y-based material having Pr 4 atomic % and Sm 4 atomic % with impurity).

Powders of hydrates of Pr(OCOCH$_3$)$_3$, Nd(OCOCH$_3$)$_3$, Sm(OCOCH$_3$)$_3$, Y(OCOCH$_3$)$_3$, Ba(OCOCH$_3$)$_2$, and Cu(OCOCH$_2$)$_2$, as metal acetates were similarly dissolved in deionized water at a metal ion molar ratio of 0.04:0.04:0.04:0.88:2:3. The resulting solution was mixed and stirred with a reaction equal molar amount of CF$_3$COOH. The resulting mixed solution was put in an eggplant-shaped flask, and was subjected to a reaction and purification in a rotary evaporator under reduced pressure for 12 hours to obtain a semitransparent blue substance 7Mi-YPr04Nd04Sm04 (substance described in Example 7, Y-based material having Pr 4 atomic %, Nd 4 atomic % and Sm 4 atomic % with impurity).

The semitransparent blue substances 7Mi-YPr04Nd04, 7Mi-YPr0.4Sm04, and 7Mi-YPr04Nd04Sm04 each contained water or acetic acid as a reaction byproduct at the time of solution synthesis at about 7 wt %.

The obtained semitransparent blue substances 7Mi-YPr04Nd04, 7Mi-YPr04Sm04, and 7Mi-YPr04Nd04Sm04 were each completely dissolved in methanol having a weight about 100 times the substance (f in FIG. 5), and the solutions were subjected to a reaction and purification again in a rotary evaporator under reduced pressure for 12 hours to obtain semitransparent blue substances 7M-YPr04Nd04 (Example 7, Y-based material having Pr 4 atomic, and Nd 4 atomic %), 7M-YPr04Sm04, and 7M-YPr04Nd04Sm04, respectively.

The semitransparent blue substances 7M-YPr04Nd04, 7M-YPr04Sm04, and 7M-YPr04Nd04Sm04 were each dissolved in methanol (j in FIG. 5), and were diluted using a measuring flask to obtain 1.50 mol/l coating solutions 7Cs—YPr04Nd04 (Example 7, coating solution for Y-based superconductor with Pr 04 atomic % and Nd 04 atomic %), 7Cs—YPr04Sm04, and 7Cs—YPr04Nd04Sm04, respectively.

Using each of the coating solutions 7Cs—YPr04Nd04, 7Cs—YPr04Sm04, and 7Cs—YPr04Nd04Sm04, a film of a superconductor was formed on a LaAlO$_3$ single crystal substrate. A film was formed at a maximum rotation speed of 4000 rpm using a spin coating method, calcining was performed in a pure oxygen atmosphere at 400° C. or lower in the profile illustrated in FIG. 7, firing was performed in a 1000 ppm oxygen mixed argon gas at 800° C. in the profile illustrated in FIG. 8, and annealing was performed in pure oxygen at 525° C. or lower to obtain superconducting films 7FS—YPr04Nd04 (Example 7, film of superconductor, YBCO having NdBCO 4 atomic %), 7FS—YPr04Sm04, and 7FS—YPr04Nd04Sm04.

The superconducting films 7FS—YPr04Nd04, 7FS—YPr04Sm04, and 7FS—YPr04Nd04Sm04 were each measured by a 2θ/ω method of XRD measurement, and a single REBCO (00n) peak was confirmed. From Examples 1 and 2, it has been found that a perovskite structure is maintained even when Pr is mixed up to 20 atomic %. However, even in 7FS—YPr04Nd04Sm04 which is a sample obtained by mixing Pr, Nd, and Sm each having a large atomic radius at 12 atomic % in total, a single peak of PrBCO (00n) is confirmed. Therefore, it seems that the perovskite structure is maintained and PrBCO is ultimately dispersed inside.

Jc values (MA/cm$^2$) of 7FS—YPr04Nd04, 7FS—YPr04Sm04, and 7FS—YPr04Nd04Sm04 were measured by an induction method under a self-magnetic field in liquid nitrogen, and were 5.7, 5.8, and 6.1, respectively. It is estimated that a result that characteristics were lowered by about 20% with respect to a sample containing no Pr was obtained due to addition of 4% PrBCO and a 5-times degradation phenomenon. The Jc values are slightly high probably because Nd and Sm with high Tc are partially included.

7FS—YPr04Nd04, 7FS—YPr04Sm04, and 7FS—YPr04Nd04Sm04 were subjected to Jc-B measurement in liquid nitrogen under conditions of 0 T and 0.9 T.

In order to evaluate a characteristic improvement effect of each element by artificial pins, evaluation was performed using Rp used in Example 2. The obtained Rp (7FS—YPr04Nd04), Rp (7FS—YPr04Sm04), and Rp (7FS—YPr04Nd04Sm04) were 1.49, 1.47 and 1.43, respectively. The characteristics were slightly low. However, a magnetic field characteristic improvement effect could be confirmed. A reason why the characteristic improvement effect was slightly low is estimated that Tc of a Nd or Sm-based superconductor is high and a characteristic is high at a starting point, and therefore an improvement ratio Rp is thereby low.

A Tc value of each sample was measured by an induction method. Tc (7FS—YPr04Nd04), Tc (7FS—YPr04Sm04), and Tc (7FS—YPr04Nd04Sm04) were 90.9 K, 90.8 K, and 91.1 K, respectively.

Whether PrBCO added to a parent phase can be mixed with NdBCO and SmBCO which are high Tc superconductors may be determined by the total atomic %. Pr having the largest ionic radius could be mixed up to 20 atomic %. However, each of Nd and Sm has a smaller ionic radius, and it is predicted that each of Nd and Sm is more stable. Therefore, it seems that an influence such as decomposition did not appear even in the system with Pr+Nd+Sm mixed up to 12% at maximum in Examples. However, it seems that only Pr functions as an artificial pin, and that the numerical value of Rp is almost the same. Rather it is slightly lower. However, as described above, it seems that this is caused by improvement of a Tc due to addition of a high Tc material Nd or Sm.

Example 8

According to the flow chart illustrated in FIG. 5, a coating solution for a PrBCO+YBCO superconductor was synthesized and purified. It was tried to form a superconductor on a metal substrate with an intermediate layer. Whether a similar effect was obtained was examined.

According to the flow chart illustrated in FIG. 5, powders of hydrates of Pr(OCOCH$_3$)$_3$, Y(OCOCH$_3$)$_3$, Ba(OCOCH$_3$)$_2$, and Cu(OCOCH$_3$)$_2$ as metal acetates were dissolved in deionized water at a metal ion molar ratio of 0.04:0.96:2:3. The resulting solution was mixed and stirred with a reaction equal molar amount of CF$_3$COOH. The resulting mixed solution was put in an eggplant-shaped flask, and was subjected to a reaction and purification in a rotary evaporator under reduced pressure for 12 hours to obtain a semitransparent blue substance 8Mi-YPr04 (substance described in Example 8, Y-based material having Pr 4 atomic % with impurity).

The semitransparent blue substance 8Mi-YPr04 contained water or acetic acid as a reaction byproduct at the time of synthesis of a solution in an amount of about 7 wt %.

The obtained semitransparent blue substance 8Mi-YPr04 was completely dissolved in methanol having a weight about 100 times the substance (f in FIG. 5), and the solution was subjected to a reaction and purification again in a rotary evaporator under reduced pressure for 12 hours to obtain a semitransparent blue substance 8M-YPr04 (substance described in Example 8, Y-based material having Pr 4 atomic %).

The semitransparent blue substance 8M-YPr04 was dissolved in methanol (j in FIG. 5), and was diluted using a measuring flash to obtain 1.50 mol/l coating solutions 8Cs—YPr04 (Example 8, coating solution for Y-based superconductor with Pr 04 atomic %).

Using the coating solution 8Cs—YPr04, a film was formed on a Ni—W alloy substrate sequentially formed with films of Y$_2$O$_3$, YSZ, and CeO$_2$ each having a thickness of 70 nm. The film structure is CeO$_2$/YSZ/Y$_2$O$_3$/Ni—W. A film was formed at a maximum rotation speed of 4000 rpm using a spin coating method, calcining was performed in a pure oxygen atmosphere at 400° C. or lower in the profile illustrated in FIG. 7, firing was performed in a 1000 ppm oxygen mixed argon gas at 800° C. in the profile illustrated in FIG. 8, and annealing was performed in pure oxygen at 525° C. or lower to obtain a superconducting film 8FS—YPr04 (Example 8, film of superconductor, YBCO mixed with additional Pr 04 atomic %).

The superconducting film 8FS—YPr04 was measured by a 2θ/ω method of XRD measurement, and a single REBCO (00n) peak was confirmed. It is known that a similar reaction occurs in a case where reaction does not occur with an intermediate layer or lower even on a metal. However, the same phenomenon has been confirmed also in this system. Even in this system, it seems that YBCO and PrBCO form a single perovskite structure.

A Jc value (MA/cm$^2$) of 8FS—YPr04 was measured by an induction method under a self-magnetic field in liquid nitrogen, and was 2.8. It is estimated that a result that characteristics were lowered by about 20% with respect to a sample containing no Pr was obtained due to addition of 4% PrBCO and a 5-times degradation phenomenon. In film formation on a metal, Ag of the intermediate layer is deteriorated and characteristics are lowered as compared with a single crystal substrate. It seems that this also has an influence on lowering of the Jc value. It seems that the characteristic are good as film formation on a metal substrate.

8FS—YPr04 was subjected to Jc-B measurement in liquid nitrogen under conditions of 0 T and 0.9 T.

In order to evaluate a characteristic improvement effect of each element by artificial pins, evaluation was performed using Rp calculated in Example 2. Using the obtained Rp, a magnetic field characteristic improvement effect due to ultimate dispersion of PrBCO was checked even in film formation on a metal. Rp was 1.52, and it has been found that there is a characteristic improvement effect as an artificial pin.

A Tc value of a sample was measured by an induction method. Tc (8FS—YPr04) was 90.5 K. Film formation was performed on a metal with an intermediate layer. However, it has been found that a good superconducting film containing an artificial pin may be obtained.

Example 9

A coating solution for a PrBCO+YBCO superconductor was synthesized and purified according to the flowchart illustrated in FIG. 5. Powders of hydrates of Pr(OCOCH$_3$)$_3$, Sm(OCOCH$_3$)$_3$, Yb(OCOCH$_3$)$_3$, Lu(OCOCH$_3$)$_3$, Y(OCOCH$_3$)$_3$, Ba(OCOCH$_3$)$_2$, and Cu(OCOCH$_3$)$_2$ as metal acetates were dissolved in deionized water at a metal ion molar ratio of x:x:2x:2x:1-6x:2:3. Solutions in which values of x (ppm) were 20000, 10000, 3000, 2000, 1000, 300, 100, 30, 10, 3, 1, 0.3, 0.1, 0.03, 0.01, 0.003, 0.001, and 0 (only YBCO superconductor) were prepared. In other words, solutions in which values of x (ppb) were 20000000, 10000000, 3000000, 2000000, 1000000, 300000, 100000, 30000, 10000, 3000, 1000, 300, 100, 30, 10, 3, 1, and 0 (only YBCO superconductor) were prepared. For solution preparation at 3000 ppm or less, a solution is diluted 1 to 3 times to be adjusted.

Each of the resulting solutions was mixed and stirred with a reaction equal molar amount of CF$_3$COOH. The resulting mixed solution was put in an eggplant-shaped flask, and was subjected to a reaction and purification in a rotary evaporator under reduced pressure for 12 hours. Semitransparent blue substances 9Mi-20000 (substance described in Example 9, material with impurity of Pr in 20000 ppm atomic ratio), 9Mi-10000, 9Mi-3000, 9Mi-2000, 9Mi-1000, 9Mi-300, 9Mi-100, 9Mi-30, 9Mi-10, 9Mi-1, 9Mi-0.3, 9Mi-0.1, 9Mi-0.03, 9Mi-0.01, 9Mi-0.003, 9Mi-0.001, and 9Mi-0 were obtained. Each of the semitransparent blue substances contained water or acetic acid as a reaction byproduct at the time of synthesis of a solution in an amount of about 7 wt %.

The obtained semitransparent blue substances 9Mi-20000, 9Mi-10000, 9Mi-3000, 9Mi-2000, 9Mi-1000, 9Mi-300, 9Mi-100, 9Mi-30, 9Mi-10, 9Mi-3, 9Mi-1, 9Mi-0.3, 9Mi-0.1, 9Mi-0.03, 9Mi-0.01, 9Mi-0.003, 9Mi-0.001, and 9Mi-0 were each completely dissolved in methanol having a weight about 100 times each of the substances (f in FIG. 5), and the solutions were subjected to a reaction and purification again in a rotary evaporator under reduced pressure for 12 hours to obtain semitransparent blue substances 9M-20000 (Example 9, material with Pr 20000 ppm atomic ratio), 9M-10000, 9M-3000, 9M-2000, 9M-1000, 9M-300, 9M-100, 9M-30, 9M-10, 9M-3, 9M-1, 9M-0.3, 9M-0.1, 9M-0.03, and 9M-0.01, respectively. The semitransparent blue substances 9M-20000, 9M-10000, 9M-3000, 2000, 9M-1000, 9M-300, 9M-100, 9M-30, 9M-10, 9M-3, 9M-1, 9M-0.3, 9M-0.1, 9M-0.03, 9M-0.01, 9M-0.003, 9M-0.001, and 9M-0 were each dissolved in methanol (j in FIG. 5), and were diluted using a measuring flask to obtain 1.50 mol/l coating solutions 9Cs—Y—Pr20000 (Example 9, coating solution for Y-based superconductor with Pr 20000 ppm atomic ratio), 9Cs—Y—Pr10000, 9Cs—Y—Pr3000, 9Cs—Y—Pr2000, 9Cs—Y—Pr1000, 9Cs—Y—Pr300, 9Cs—Y—Pr100, 9Cs—Y—Pr30, 9Cs—Y—Pr10, 9Cs—Y—Pr3, 9Cs—Y—Pr1, 9Cs—Y—Pr0.3, 9Cs—Y—Pr0.1, 9Cs—Y—Pr0.03, 9Cs—Y—Pr0.01, 9Cs—Y—Pr0.003, 9Cs—Y—Pr0.001, and 9Cs—Y—Pr0, respectively.

Using each of the coating solutions 9Cs—Y—Pr20000, 9Cs—Y—Pr10000, 9Cs—Y—Pr3000, 9Cs—Y—Pr2000, 9Cs—Y—Pr1000, 9Cs—Y—Pr300, 9Cs—Y—Pr100, 9Cs—Y—Pr30, 9Cs—Y—Pr10, 9Cs—Y—Pr3, 9Cs—Y—Pr1, 9Cs—Y—Pr0.3, 9Cs—Y—Pr0.1, 9Cs—Y—Pr0.03, 9Cs—Y—Pr0.01, 9Cs—Y—Pr0.003, 9Cs—Y—Pr0.001, and 9Cs—Y—Pr0, a film of a superconductor was formed on a LaAlO$_3$ single crystal substrate.

A film was formed at a maximum rotation speed of 2000 rpm using a spin coating method, calcining was performed in a pure oxygen atmosphere at 400° C. or lower in the profile illustrated in FIG. 7, firing was performed in a 1000 ppm oxygen mixed argon gas at 800° C. in the profile illustrated in FIG. 8, and annealing was performed in pure oxygen at 525° C. or lower to obtain superconducting films 9FS—Y—Pr20000 (Example 9, film of superconductor, Y-based with Pr 20000 ppm atomic ratio), 9FS—Y—Pr10000, 9FS—Y—Pr3000, 9FS—Y—Pr2000, 9FS—Y—Pr1000, 9FS—Y—Pr300, 9FS—Y—Pr100, 9FS—Y—Pr30, 9FS—Y—Pr10, 9FS—Y—Pr3, 9FS—Y—Pr1, 9FS—Y—Pr0.3, 9FS—Y—Pr0.1, 9FS—Y—Pr0.03, 9FS—Y—Pr0.01, 9FS—Y—Pr0.003, 9 FS—Y—Pr0.001, and 9FS—Y—Pr0.

The superconducting films 9FS—Y—Pr20000, 9FS—Y—Pr10000, 9FS—Y—Pr3000, 9FS—Y—Pr2000, 9FS—Y—Pr1000, 9FS—Y—Pr300, 9FS—Y—Pr100, 9FS—Y—Pr30, 9FS—Y—Pr10, 9FS—Y—Pr3, 9FS—Y—Pr1, 9FS—Y—Pr0.3, 9FS—Y—Pr0.1, 9FS—Y—Pr0.03, 9FS—Y—Pr0.01, 9FS—Y—Pr0.003, 9FS—Y—Pr0.001, and 9FS—Y—Pr0 were each measured by a 2θ/ω method of XRD measurement. As a result, a peak having a single lattice constant as a TBCO superconductor was obtained. Even in this superconductor, it seems that a PrBCO artificial pin is formed while a perovskite structure is maintained.

Figure 12:
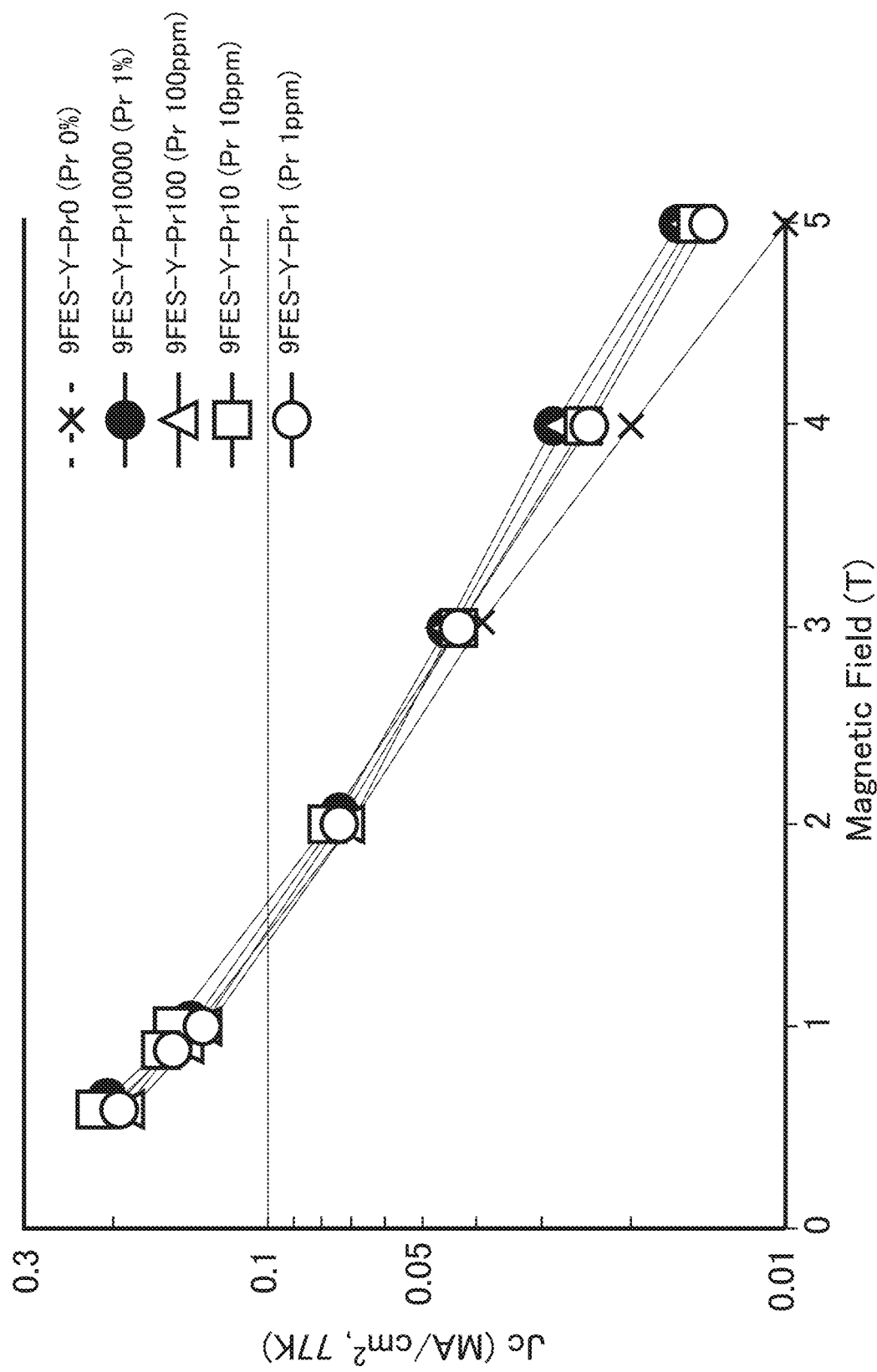
FIG. 12 is a graph illustrating a relationship between a magnetic field and a critical current density in an oxide superconductor in Example.

FIG. 12 illustrates a relationship between a magnetic field and a critical current density in an oxide superconductor in Example. FIG. 12 illustrates a result obtained by performing Jc-B measurement of FS—Y—Pr10000(Pr1%) and 9FS—Y—Pr0(Pr0%) under conditions of 77.4 K and 1 T to 5 T.

9FS—Y—Pr0 (Pr 0%) is a YBCO film in Comparative Example, and indicates a high Jc value peculiar to a film by the TFA-MOD method. The Jc value reaches 6.3 MA/cm$^2$ (77 K,0 T).

Note that the YBCO film in Comparative Example has a film thickness of 220 nm and the film was formed on a LaAlO$_3$ single crystal substrate. Therefore, a/b axis oriented particles are formed, and characteristics thereof are lower than those of a film having a film thickness of 150 nm. As a sample, a LaAlO$_3$ single crystal substrate of 10×30×0.5 t (mm) is used. A film having a film thickness of 220 nm is used with a rotation speed of spin coating set at 2000 rpm. Unlike film formation on CeO$_2$, a/b axis oriented particles are easily formed on LaAlO$_3$, and characteristics are lowered as a film thickness increases. In a case of a YBCO superconductor exhibiting good superconducting characteristics, it is known that a superconductor having good characteristics of a Jc value of 7.5 MA/cm$^2$ at 150 nm under conditions of 77 K and 0 T has characteristics of a Jc value of about 6.5 MA/cm$^2$ at 220 nm.

FIG. 12 indicates that characteristics of 9FS—Y—Pr0 which is a YBCO superconductor are lowered as a magnetic field is higher. Characteristics of 9FS—Y—Pr10000 in which an artificial pin is introduced are slightly effective at 0.9 T. However, the characteristics are not remarkably high up to about 3 T compared with 9FS—Y—Pr0. However, as the magnetic field is higher, the characteristics are better and a difference from 9FS—Y—Pr0 is significantly larger at 4 to 5 T. It is considered that the characteristics are improved at a high magnetic field by an effect of artificial pins.

In a case where Pr is added under conditions of 77 K and 5 T which is data at 5 T in FIG. 12, a magnetic field characteristic improvement effect (R(PrC)) for 9FS—Y—Pr0 in Comparative Example is defined as follows.

R(PrC)=Jc(77 K and 5 T,9FS—Y—PrC)/Jc(77 K and 5 T, 9FS—Y—Pr0)

In the above formula, C represents a concentration represented by unit of ppm. R (PrC) of more than 1 indicates that there is an effect as an artificial pin. R (Pr 10000 ppm)=1.60 indicates that characteristics at 77 K and 5 T are 1.60 times higher than those of a YBCO superconductor containing no artificial pin and that there is an effect.

As seen from FIG. 12, it is difficult to judge characteristic improvement at 0.9 at 77 K. However, a large difference is observed at 5 T which is a high magnetic field. Therefore, an effect of artificial pins is sufficient even if the content of Pr is less than 0.3% which is considered to be a small difference in Example 3. It is considered that a clear effect was exhibited at 5 T.

Data of 9FS—Y—Pr100 (100 ppm), 9FS—Y—Pr10 (10 ppm), and 9FS—Y—Pr1 (1 ppm) is also illustrated in FIG. 12. As seen from FIG. 12, a sufficient characteristic improvement effect is obtained at 77 K and 5 T even at Pr 1 ppm. R (Pr 1 ppm) is 1.41, and the difference can also be confirmed from the graph. As described later, R (Pr 0.01 ppm) is 1.31 even at 100 ppb, indicating an effect. In artificial pins reported in the past, in general, Jc-B-T characteristics are improved by adding 7.5% $BaZrO_3$ (BZO) artificial pins, for example, in film formation by a PLD method or a MOCVD method. It is said that BZO artificial pins are almost ineffective when the amount thereof is small. There has been few reports of addition in an amount of less than 1%. Meanwhile, the atomic substitution type artificial pin in the present Example is effective at 0.01 ppm (10 ppb), and can be said to be one million times more effective when compared with the amount of Pr substitution at a Y site.

A reason why such unexpected pin force is generated is considered as follows. In a BZO artificial pin, BZO which is an artificial pin introduced not only becomes non-superconducting but also has the same perovskite structure with a lattice constant difference of 9%. Therefore, it is said that superconducting characteristics are lowered because a gap is easily formed. In addition, it is said that BZO takes away an oxygen atom from YBCO and lowers superconducting characteristics. Therefore, even if a superconductor which can obtain Tc=90.7 K which is the best condition of YBCO is formed, a distance to the superconductor in the best state is far from a BZO artificial pin.

In an intermediate region between the superconductor in the best state and the BZO artificial pin, a potential in a superconducting state through which a quantum flux passes gradually changes. A potential gradient is a pin force. Therefore, it is considered that the pin force decreases as the potential gradually changes.

The BZO artificial pin randomly lowers the superconducting characteristics of the YBCO superconductor. Therefore, there is a small potential difference, and many places where a quantum flux easily moves from a BZO artificial pin are formed. In a BZO type artificial pin that lowers surrounding superconducting characteristics, it is considered that it is difficult to largely improve superconducting characteristics in a magnetic field in an artificial pin where a potential gradient is a pin force.

Meanwhile, in the atomic substitution type artificial pin, an artificial pin is formed adjacent to a superconducting unit cell. Therefore, it is predicted that pin power will have an ultimate magnitude. The atomic substitution type artificial pin does not have a pin force a million times the BZO artificial pin. It seems to be correct understanding that only a pin force of 1/1,000,000 with respect to a pin force which should originally exist can be obtained in a case of the BZO artificial pin.

Incidentally, only introduction of Pr in YBCO causes ultimate dispersion, an artificial pin has a size of 0.4 nm in an a/b in-plane direction, and there is a fear that an effect is hardly obtained. In order to obtain a function as an artificial pin, it is considered that it is desirable to accumulate Pr unit cells to some extent. A clustering phenomenon seems to exhibit an effect on the accumulation.

The clustering phenomenon was discovered by Araki who is one of inventors of the present invention, or the like. The clustering phenomenon is a phenomenon in which SmBCO and LuBCO form an assembly when a SmBCO unit cell having a large size and a small LuBCO unit cell coexist using a YBCO unit cell as a parent phase. PrBCO and LuBCO do not form a cluster. Therefore, PrBCO and SmBCO were prepared as large unit cells and YbBCO and LuBCO were prepared as small unit cells in Example, clustering of Pr was attempted by adding Yb and Lu in an amount of twice the amount of Pr+Sm.

At present, a means to examine clustering described above has not been necessarily established, and it is difficult to observe clustering directly by TEM observation or the like. This is because a cross-sectional observation image as if one perovskite structure is formed is observed in TEM observation, and judgement is impossible. Only improvement of Jc-B-T characteristics indirectly indicates clustering. Although only estimated indirectly, in clustering at Pr:Sm:Yb:Lu=1:1:2:2, Jc-B-T characteristics are improved, and therefore it can be estimated that clustering has occurred.

Figure 13:
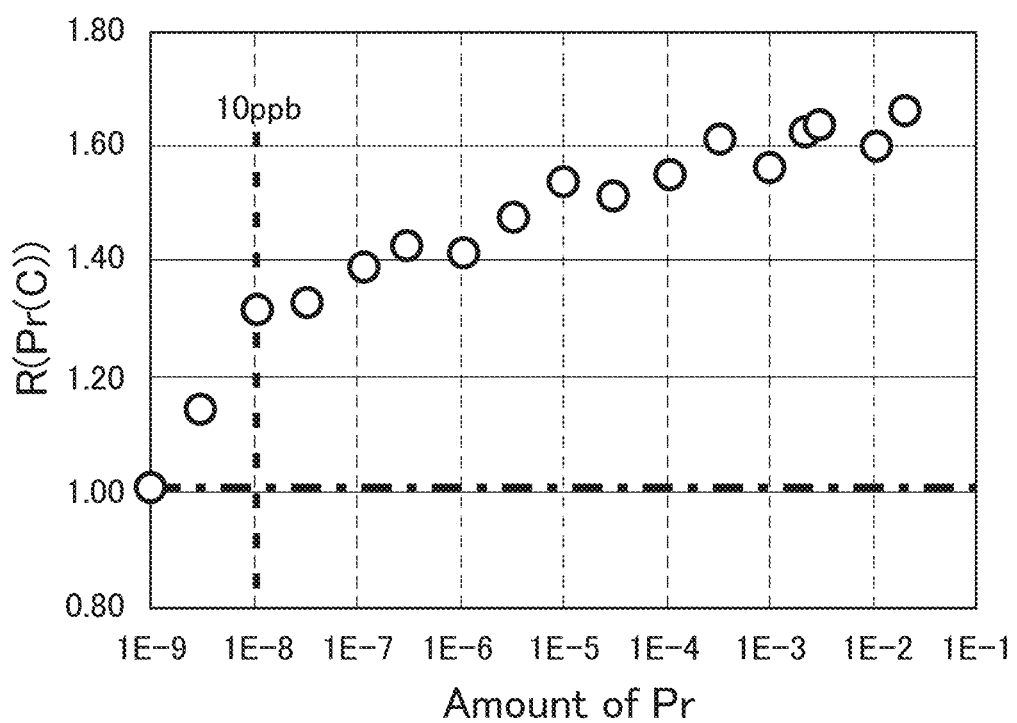
FIG. 13 is a graph illustrating a relationship between the amount of Pr and a critical current density in the oxide superconductor in Example.

FIG. 13 is a graph illustrating a relationship between the amount of Pr and a critical current density in the oxide superconductor in Example. FIG. 13 illustrates a result of examination as a graph in which the X axis indicates a Pr concentration in logarithmic axis display and the Y axis indicates a magnetic field characteristic improvement effect (R (PrC)) in order to examine a relationship between the amount of Pr and the magnetic field characteristic improvement effect (R (PrC)).

As seen from FIG. 13, an effect is observed until the content of Pr is 10 ppb. When the content of Pr is 3 ppb, it is difficult to distinguish a characteristic difference from an ordinary YBCO superconductor. Therefore, it is considered that Pr is effective at the content of Pr of 10 ppb or more. This amount is an extremely small amount of one millionth of the amount required for exhibition of an effect by a BZO artificial pin YBCO.

Small amounts of Pr and Sm should have been mixed in a past bulk superconductor. However, PrBCO and SmBCO have largely different optimum oxygen partial pressures formed from a YBCO superconductor. The optimum oxygen partial pressure of YBCO at 800° C. is 1000 ppm. However, the optimal oxygen partial pressures of SmBCO and PrBCO seem to be 20 ppm and 1 ppm, respectively. A method for manufacturing a bulk body cannot eliminate this difference.

A structure in which Pr is mixed in part while a perovskite structure is formed has not been realized.

The same can be said for a vacuum physical vapor deposition method such as a PLD method or a MOCVD method. YBCO and SmBCO cannot be formed in the same perovskite structure because of a large difference in optimum oxygen partial pressure. However, it is predicted that YBCO and SmBCO will be formed in the same perovskite structure while SmBCO is unevenly distributed and partly decomposed even if YBCO and SmBCO can be formed in the same perovskite structure. In addition, there has been no report on an example in which unit cells having largely different sizes are mixed and formed in a perovskite structure by a physical vapor deposition method.

The TFA-MOD method can exceptionally mix and form YBCO, SmBCO, PrBCO, YbBCO, and LuBCO, but cannot mix and form YBCO, SmBCO, PrBCO, YbBCO, and LuBCO unconditionally. If a solution contains a substance having a hydrogen atom, such as naphthenic acid or octylic acid, the substance reacts with a fluorine atom of TFA to generate residual carbon, an inside becomes nonuniform, and the above unit cells are not mixed and formed. Actually, there has been no report that a perovskite structure is completely maintained from these groups, and it has been mainly reported that a heterogeneous phase is formed inside.

Even if manufacturing is performed only using a TFA salt without using the above chemical substance having a hydrogen atom, unless a solution is highly purified, CuO particles and the like are precipitated, and unit cells with a large size difference form a cluster to prevent formation of a perovskite structure with the same lattice constant. This is because this method is characterized by manufacturing a Pr-TFA salt by a partially stabilized SIG method (PS-SIG method) with a high purity solution. Therefore, such a structure in which a perovskite structure containing Pr is formed has not been reported in the past. One important element of realization of the present Example is the PS-SIG method.

In the embodiment, the superconducting wire material has been exemplified. However, the oxide superconductor of the present invention can be applied also to other applications such as a thin film requiring high magnetic field characteristics on a single crystal substrate.

While certain embodiments have been described, these embodiments have been presented by way of example only, and are not intended to limit the scope of the inventions. Indeed, oxide superconductor and method for manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. An oxide superconductor comprising an oxide superconducting layer including:
    a single crystal having continuous perovskite structure, the single crystal containing at least one rare earth element selected from the group consisting of yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (M), and lutetium (Lu), the single crystal containing barium (Ba) and copper (Cu), the single crystal containing praseodymium (Pr) in a part of sites of rare earth element in perovskite structure, and the single crystal having a molar ratio of praseodymium of 0.00000001 or more and 0.2 or less with respect to the sum of the at least one rare earth element and praseodymium;
    fluorine in an amount of $2.0 \times 10^{15}$ atoms/cc or more and $5.0 \times 10^{19}$ atoms/cc or less; and
    carbon in an amount of $1.0 \times 10^{17}$ atoms/cc or more and $5.0'10^{20}$ atoms/cc or less.

2. The oxide superconductor according to claim 1, wherein a c-axis length of the single crystal is shorter than a c-axis length of a single crystal having perovskite structure which includes the at least one rare earth element, barium, and copper, and which has a molar ratio of praseodymium of less than 0.00000001 with respect to the sum of the at least one rare earth element and praseodymium.

3. The oxide superconductor according to claim 1, wherein the single crystal in the oxide superconducting layer has a composition of $(M, Pr) Ba_2Cu_3O_{7-x}$ ($-0.2 \leq x \leq 1$) in a case where the at least one rare earth element is represented by M.

4. The oxide superconductor according to claim 1, wherein in the single crystal, a ratio of unit cells containing the at least one rare earth element is 0.0050 or more with respect to all unit cells that can be adjacent to a unit cell containing praseodymium.

5. The oxide superconductor according to claim 1, wherein in the single crystal, a ratio of unit cells containing the at least one rare earth element is 0.010 or more with respect to all unit cells that can be adjacent to unit cells containing praseodymium.

6. The oxide superconductor according to claim 1, wherein in the single crystal, a ratio of unit cells containing the at least one rare earth element is 0.025 or more with respect to all unit cells that can be adjacent to unit cells containing praseodymium.

7. The oxide superconductor according to claim 1, wherein a region containing praseodymium in the single crystal a non-superconductor.

8. The oxide superconductor according to claim 1, wherein the at least one rare earth element is yttrium.

9. The oxide superconductor according to claim 1, wherein a molar ratio or praseodymium with respect to the sum of the at least one rare earth element and praseodymium is 0.000001 or more and 0.1 or less.

10. The oxide superconductor according to claim 1, further comprising a substrate and a metal layer, wherein
    the oxide superconducting layer is present between the substrate and the metal layer.

11. The oxide superconductor according to claim 10, wherein the oxide superconducting layer is present on the substrate, and the single crystal is present in a range of 50 nm or more from substrate side in the oxide superconducting layer and 70% or less of an average layer thickness of the oxide superconducting layer from the substrate side.

12. The oxide superconductor according to claim 11, wherein the single crystal has a size of 500 nm×100 nm or more in a cross section of the oxide superconducting layer in a layer thickness direction thereof.

* * * * *

UNITED STATES PATENT AND TRADEMARK OFFICE
CERTIFICATE OF CORRECTION

PATENT NO.        : 10,916,361 B2
APPLICATION NO.   : 15/887135
DATED             : February 9, 2021
INVENTOR(S)       : Mariko Hayashi et al.

Page 1 of 1

It is certified that error appears in the above-identified patent and that said Letters Patent is hereby corrected as shown below:

In the Claims

In Claim 1, Column 44, Line 1, "ytterbium (M)," should read --ytterbium (Yb),--.

In Claim 1, Column 44, Line 12, "5.0' $10^{20}$ atoms/cc" should read --5.0 H $10^{20}$ atoms/cc--.

In Claim 7, Column 44, Line 42, "crystal a non-superconductor." should read --crystal is a non-superconductor.--.

In Claim 9, Column 44, Line 46, "molar ratio or praseodymium" should read --molar ratio of praseodymium--.

Signed and Sealed this
First Day of June, 2021

Drew Hirshfeld
*Performing the Functions and Duties of the*
*Under Secretary of Commerce for Intellectual Property and*
*Director of the United States Patent and Trademark Office*